(12) United States Patent
Fischer

(10) Patent No.: US 8,497,600 B2
(45) Date of Patent: Jul. 30, 2013

(54) CELL SITE POWER SYSTEM MANAGEMENT, INCLUDING BATTERY CIRCUIT MANAGEMENT

(71) Applicant: Steve Fischer, Redmond, WA (US)

(72) Inventor: Steve Fischer, Redmond, WA (US)

(73) Assignee: T-Mobile USA, Inc., Bellevue, WA (US)

( * ) Notice: Subject to any disclaimer, the term of this patent is extended or adjusted under 35 U.S.C. 154(b) by 0 days.

(21) Appl. No.: 13/676,022

(22) Filed: Nov. 13, 2012

(65) Prior Publication Data

US 2013/0069433 A1  Mar. 21, 2013

Related U.S. Application Data

(63) Continuation of application No. 12/726,265, filed on Mar. 17, 2010, now Pat. No. 8,310,103.

(51) Int. Cl.
*H02J 1/00* (2006.01)
*H02J 3/00* (2006.01)

(52) U.S. Cl.
USPC .......................................................... 307/85

(58) Field of Classification Search
USPC .................. 307/44, 66, 71, 77, 85; 320/116
See application file for complete search history.

(56) References Cited

U.S. PATENT DOCUMENTS

| | | | |
|---|---|---|---|
| 4,931,947 A | 6/1990 | Werth et al. |
| 5,099,694 A | 3/1992 | Sumio et al. |
| 5,185,684 A | 2/1993 | Beihoff et al. |
| 5,332,927 A | 7/1994 | Paul et al. |
| 5,602,459 A | 2/1997 | Rogers |
| 5,886,503 A | 3/1999 | McAndrews et al. |
| 5,894,407 A | 4/1999 | Aakalu et al. |
| 5,934,079 A | 8/1999 | Han et al. |
| 5,939,990 A | 8/1999 | Ahn |
| 6,188,591 B1 | 2/2001 | Ruter et al. |
| 6,223,037 B1 | 4/2001 | Parkkila |
| 6,281,602 B1 | 8/2001 | Got et al. |
| 6,304,059 B1 | 10/2001 | Chalasani et al. |
| 6,343,498 B1 | 2/2002 | Oba et al. |
| 6,463,295 B1 | 10/2002 | Yun |

(Continued)

FOREIGN PATENT DOCUMENTS

| EP | 1296464 | 10/2007 |
|---|---|---|
| KR | 200380026 Y1 | 3/2005 |

(Continued)

OTHER PUBLICATIONS

International Search Report and Written Opinion for PCT/US2009/050313; Filed on Jul. 10, 2009, Applicant: T-Mobile USA, Inc.; Date of Mailing: Sep. 3, 2009, 14 pages.

(Continued)

*Primary Examiner* — Carlos Amaya
(74) *Attorney, Agent, or Firm* — Perkins Coie LLP

(57) ABSTRACT

Systems, apparatuses, and methods for managing battery circuits in systems such as wireless communications service base stations are disclosed. An example apparatus includes a battery circuit having multiple strings of one or more serially connected batteries. The apparatus may be configured to rotate between battery strings such that one or more strings are maintained at or near an upper threshold while other string(s) are disconnected from the maintained string(s). The apparatus may also be configured to charge the battery circuit, to test the battery circuit, and to handle power failures.

20 Claims, 7 Drawing Sheets

U.S. PATENT DOCUMENTS

| | | | |
|---|---|---|---|
| 6,533,031 | B1 | 3/2003 | Garcia et al. |
| 6,577,478 | B2 | 6/2003 | Kim et al. |
| 6,583,603 | B1 | 6/2003 | Baldwin |
| 6,639,769 | B2 | 10/2003 | Neiger et al. |
| 6,700,802 | B2 | 3/2004 | Ulinski et al. |
| 6,751,205 | B2 | 6/2004 | Menon et al. |
| 6,782,264 | B2 | 8/2004 | Anderson |
| 6,889,752 | B2 | 5/2005 | Stoller |
| 6,929,785 | B2 | 8/2005 | Grieve et al. |
| 7,164,667 | B2 | 1/2007 | Rayment et al. |
| 7,245,212 | B2 | 7/2007 | Cope et al. |
| 7,366,120 | B2 | 4/2008 | Handforth et al. |
| 7,466,225 | B2 | 12/2008 | White, II et al. |
| 7,904,115 | B2 | 3/2011 | Hageman et al. |
| 7,970,585 | B2 | 6/2011 | Van Sloun et al. |
| 8,005,510 | B2 | 8/2011 | Fischer |
| 8,279,074 | B2 | 10/2012 | Fischer |
| 8,310,103 | B2 | 11/2012 | Fischer |
| 2004/0178770 | A1* | 9/2004 | Gagnon et al. ............... 320/132 |
| 2004/0218567 | A1 | 11/2004 | Budka et al. |
| 2005/0213527 | A1 | 9/2005 | Xie |
| 2006/0182262 | A1 | 8/2006 | Goldman et al. |
| 2007/0086132 | A1 | 4/2007 | Ravera et al. |
| 2007/0119638 | A1 | 5/2007 | Grieve |
| 2008/0013528 | A1 | 1/2008 | Miller et al. |
| 2008/0042493 | A1 | 2/2008 | Jacobs |
| 2008/0064361 | A1 | 3/2008 | Bjork et al. |
| 2010/0009724 | A1 | 1/2010 | Fischer |
| 2011/0021186 | A1 | 1/2011 | Fischer |

FOREIGN PATENT DOCUMENTS

| | | |
|---|---|---|
| WO | WO-97/34432 A1 | 9/1997 |
| WO | WO-2010006307 A1 | 1/2010 |
| WO | WO-2010006308 A1 | 1/2010 |
| WO | WO-2011011791 A2 | 1/2011 |
| WO | WO-2011115640 A1 | 9/2011 |

OTHER PUBLICATIONS

International Search Report and Written Opinion for PCT/US2009/050315; Filed on Jul. 10, 2008; Applicant: T-Mobile USA, Inc.; Date of Mailing: Sep. 10, 2009, 12 pages.

"System Design," Hunter International, http://209.85.173.104/search?q=cache:w3UiSdhZ7gYJ:www.functional-telecom.com/page . . . , Aug. 22, 2008, 2 pages.

"Proton exchange membrane fuel cell," Wikipedia, http://en.wikipedia.org/wiki/Proton_exchange_membrane_fuel_cell, Feb. 25, 2009, 6 pages.

"Fuel Processing," IdaTech Advanced Fuel Cell Solutions, http://www.idatech.com/Fuel-Cell-Technology-Fuel-Processing.asp, Feb. 25, 2009, 1 page.

"Fuel Cells," IdaTech Advanced Fuel Cell Solutions, http://www.idatech.com/Fuel-Cell-Technology-Fuel-Cells.asp, Feb. 25, 2009, 1 page.

"Methanol," IdaTech Advanced Fuel Cell Solutions, http://www.idatech.com/Fuel-Cell-Technology-Methanol.asp, Feb. 25, 2009, 2 pages.

"iGen™ Fuel Cell Power Supply," IdaTech LLC., Copyright 2002-2007, 2 pages.

"ElectraGen™ XTi Integrated Fuel Cell System," IdaTech LLC., Copyright 2002-2007, 2 pages.

"Glossary," IdaTech Advance Fuel Cell Solutions, http://www.idatech.com/Fuel-Cell-Technology-Glossary.asp, Feb. 25, 2009, 2 pages.

"Battery Charging," IdaTech Advance Fuel Cell Solutions, http://www.idatech.com/Products-Services-Utilities.asp, Feb. 25, 2009, 1 page.

"Generator Start Control Module—MINI (2 Wire to 3 Wire)," Atkinson Electronics, Inc., Rev. Sep. 2005, 8 pages.

International Search Report and Written Opinion for PCT/US2010/043267; Filed on Jul. 26, 2010, Applicant: T-Mobile USA, Inc.; Date of Mailing: Apr. 5, 2011, 9 pages.

International Search Report and Written Opinion for PCT/US2010/043263; Filed on Jul. 26, 2010; Applicant: T-Mobile USA, Inc.; Date of Mailing: Apr. 15, 2011, 8 pages.

* cited by examiner

CELL SITE POWER SYSTEM MANAGEMENT, INCLUDING BATTERY CIRCUIT MANAGEMENT

CROSS-REFERENCES TO RELATED APPLICATIONS

This application is a continuation application of U.S. patent application Ser. No. 12/726,265, filed on Mar. 17, 2010, and entitled "CELL SITE POWER SYSTEM MANAGEMENT, INCLUDING BATTERY CIRCUIT MANAGEMENT," which is hereby incorporated herein in its entirety by reference. This application is also related to International Patent Application No. PCT/US2010/043263 filed Jul. 26, 2010, which is incorporated by reference herein in its entirety.

BACKGROUND

The popularity of commercial wireless communications services (e.g., wireless telephony, wireless network access, and wireless email) has substantially increased during recent years. In many cases, users, such as consumers, mobile workers, emergency response personnel, and the like, now utilize these services for both personal and business communications. Likewise, users are also increasingly relying on these services. For example, some households forgo wired telephone service in favor of wireless telephone service, some government agencies rely on these services for both routine and emergency communications, and businesses rely on these services to communicate with customers and mobile workers. Correspondingly, the cost (both financial and nonfinancial) of outages is also increasing.

Typical commercial wireless communications service (CMRS) providers rely on remote facilities to provide services, such as base stations (e.g., cell sites, radio repeaters, wireless to backhaul interfaces, etc.). If a base station experiences a loss of externally provided electrical power (e.g., due to natural disasters, rolling brownouts, accidents, etc.), users near the base station may experience a service outage. To decrease reliance on externally provided power, many base stations include backup batteries. However, the amount of energy storable in backup batteries of a base station is typically limited by constraints such as maximum size, weight, and cost, etc.

Recent advancements in battery technology have drastically increased the amount of energy that can be stored (e.g., the amount of energy per unit size, per unit weight, etc.). Further, recent advancements have also drastically increased the rate at which batteries may be charged and/or discharged and improved the self-discharge rates. In light of these and other advancements, it may be beneficial to more effectively manage battery circuits, for example, to increase the amount of time that base stations can operate from battery circuits, to increase battery circuit longevity, to detect battery circuit failures, and the like.

DETAILED DESCRIPTION

Figure 1:
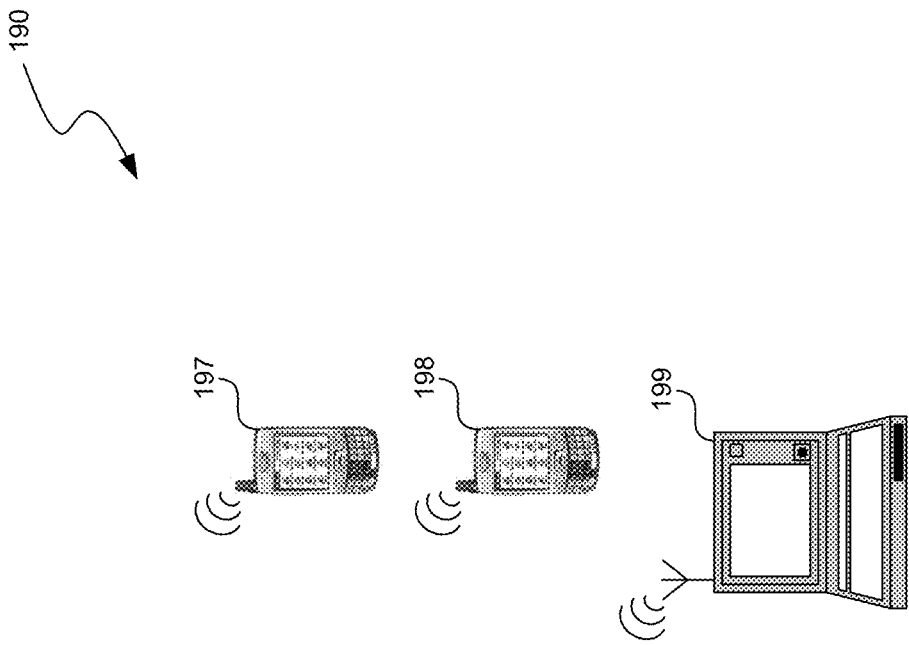
FIG. 1 is a block diagram of an environment for practicing the invention.
Figure 1:
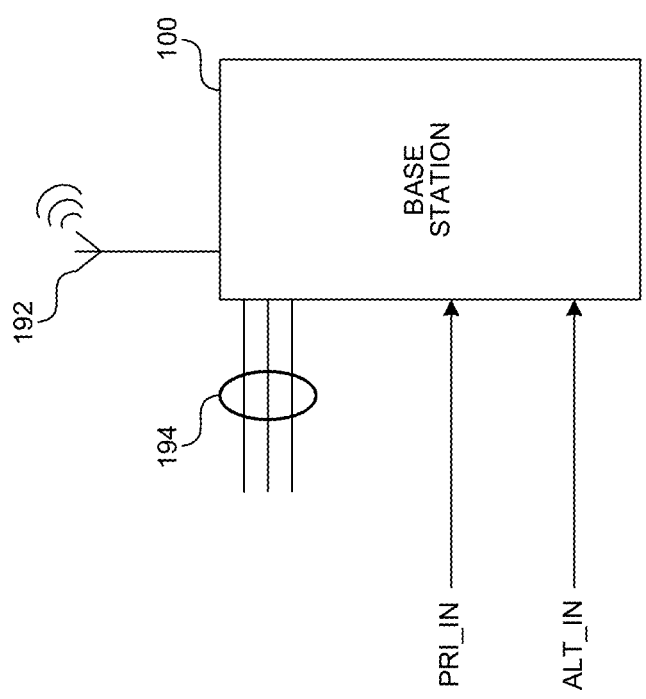

The following description provides specific details for a thorough understanding of, and enabling description for, various embodiments of the technology. One skilled in the art will understand that the technology may be practiced without many of these details. In some instances, well-known structures and functions have not been shown or described in detail to avoid unnecessarily obscuring the description of the embodiments of the technology. The terminology used in the below description should be interpreted in its broadest reasonable manner, even though it is being used in conjunction with a detailed description of certain embodiments of the technology. Although certain terms may be emphasized below, any terminology intended to be interpreted in any restricted manner will be overtly and specifically defined as such in this Detailed Description section.

When a power outage occurs, often it is in the context of a crisis situation (e.g., storm, natural disaster, etc.) where emergency service personnel and others may rely even more heavily on mobile telecommunication services. Base stations, including those near hospitals, police and fire stations, etc., may therefore utilize a backup battery circuit to avert service interruptions during a power outage. A typical base station constantly maintains all the batteries in its battery circuit in a fully charged state using a continuous charging source, with the ostensible goal of ensuring that the base station can operate for the longest possible time during a power outage.

The applicants recognized certain drawbacks of this approach. As one example, constantly charging batteries causes chemical erosion and other detrimental effects that reduce the lifetime of the batteries. A reduced battery life may mean that backup battery circuits are more likely to fail during a critical period. Reduced battery life can also be costly: a telecommunications provider with a widespread access network may spend upwards of $10 million a year on replacement batteries, for example. Reduced battery life can also have significant environmental impacts, since often times base stations utilize lead-acid or similar batteries that may generate pollutants during charging and/or require special disposal. Due to the environmental impact, governments may levy taxes and fees against the operator of a base station on a per-battery basis and/or require special operational protocols (e.g., obtaining an official "death certificate" that verifies that an operator properly disposed of a dead battery). These regulations may further increase the operating expenses of base stations in proportion to the number of batteries consumed.

Applicants have realized that the goal of maximizing backup time during a power outage must be balanced against the goal of improving the lifetime of batteries. Given the recent advances in battery technology, some batteries have self-discharge rates as low as approximately 2-3% per month and may be smaller and/or less expensive than before. These advances mean that a base station may "park" extra batteries by giving them a break (e.g., a month-long break) from constant charging, which improves their lifetimes. The length of the break will depend in part on the self-discharge rate. A base station may then only charge the parked batteries intermittently (e.g., monthly) in order to maintain them at an acceptably high level of charge (e.g., 95%) at all times. To further improve battery lifetimes, a base station may rotate the various batteries so that each spends an approximately equal amount of time in a parked state. During a power outage, the base station may, with proper management, utilize both the fully charged "active" batteries and the partially charged "parked" batteries to provide power to the base station.

Constantly charging all batteries also makes it more difficult to test a battery for failures. Testing a fully charged battery for failures typically requires that the base station first actively discharge the battery, which further reduces that battery's lifetime. Since a parked battery naturally self-discharges while it is parked, a base station may test the parked battery for anomalies or failures during the intermittent charging of the parked battery, without first actively forcing a discharge of the battery. To test a battery for anomalies, the base station may compare the battery's charging behavior against the charging behavior of other batteries and/or against expected/empirical discharge rates. In this way, parking batteries improves the lifetime of the batteries while still providing regular testing of the battery circuit.

Systems, apparatuses, and methods for managing battery circuits in systems such as wireless communications service base stations are disclosed. An example apparatus includes a battery circuit having multiple strings of one or more serially connected batteries. The apparatus may be configured to rotate between battery strings such that one or more "active" strings are maintained regularly or continuously with a charging float voltage source or other type of maintenance source while one or more other "parked" strings are disconnected from the maintained active string(s) and the charging float voltage source. The apparatus may also be configured to charge the battery circuit, to test the battery circuit, to rotate battery strings, to handle power failures, etc.

An example process provides a method for charging and/or testing multiple battery strings. The process may select a parked string, connect it to active string(s) and a charging source, charge and test the selected parked string, and disconnect the selected parked string. The system may then provide a top-off charge to all of the battery strings in parallel.

Another example process provides a method for handling a power failure using multiple battery strings. The process may monitor the voltage of connected string(s) that discharge while those strings provide power to a load during a power failure. As the voltage of the connected string(s) drops due to the power demands of the load and eventually reaches the voltage of a parked string, the system may select the intercepted parked string and connect it to the load.

Utilizing and rotating between multiple battery strings results in several benefits. First, the system reduces unnecessary charging, resulting in lower power expenditures and less heat in the battery compartment. Second, each string may spend less time on a float voltage source, so the average battery life may increase, and batteries are less likely to become unbalanced. Third, the system may test batteries without discharging the batteries, which also improves the average life of the batteries. Fourth, the system may remotely test the various battery strings and send alerts as strings fail, reducing the need for service calls. Fifth, if necessary, the combined charge of the various strings provides increased battery capacity to increase the system's run time during a power failure. Other benefits of course exist.

Suitable System

FIG. 1 is a block diagram of environment 190 in which the invention may be practiced. As shown, environment 190 includes base station 100 configured to wirelessly communicate with wireless devices 197-199. Base station 100 includes antenna 192, is coupled to back-haul 194, and is configured to receive power via primary power signal PRI_IN and alternate power signal ALT_IN.

Base station 100 may include virtually any device for facilitating wireless network access. For example, base station 100 may be a wireless telephony base station, a wireless network access base station, a wireless email base station, and/or the like. In one embodiment, base station 100 is operated by a mobile telephony service provider or CMRS. Generally, base station 100 is configured to provide a network interface for wireless devices 197-199 by providing an interface (via antenna 192) between wireless devices 197-199 and back-haul 194. Base station 100 and wireless devices 197-199 may communicate using any wireless protocol or standard. These include, for example, Global System for Mobile Communications (GSM), Time Division Multiple Access (TDMA), Code Division Multiple Access (CDMA), Orthogonal Frequency Division Multiple Access (OFDM), General Packet Radio Service (GPRS), Enhanced Data GSM Environment (EDGE), Advanced Mobile Phone System (AMPS), Worldwide Interoperability for Microwave Access (WiMAX), Universal Mobile Telecommunications System (UMTS), Evolution-Data Optimized (EVDO), Long Term Evolution (LTE), Ultra Mobile Broadband (UMB), and the like.

Back-haul 194 may be any connection that provides a network interface for base station 100. For example, back-haul 194 may include one or more T-1 connections, T-3 connections, OC-3 connections, frame relay connections, Asynchronous Transfer Mode (ATM) connections, microwave connections, Ethernet connections, and/or the like. In addition, back-haul 194 may provide an interface to a telephone switch (e.g., to a 5ESS switch or a Private Branch Exchange switch), to a data network (e.g., to a router or network switch), and the like.

Base station 100 may also be configured to receive power via primary power signal PRI_IN, for example, as alternating current (AC) power from a public utility, from a power grid, from photovoltaic power sources (e.g., solar panels or arrays), from a turbine, from a fuel cell, from a generator, and/or the like. However, primary power signal PRI_IN may be provided by virtually any power source and may be provided as either AC and/or direct current (DC) power.

Further, base station 100 may also be configured to receive power via alternate power signal ALT_IN, for example, an alternate energy power source. Alternative energy sources may include photovoltaic power sources, wind power sources, geothermal power sources, generators, fuel cells, bioreactors, and/or the like. In typical environments, DC power is received by base station 100 via alternate power signal ALT_IN. However, either AC and/or DC power may be received via alternate power signal ALT_IN.

At times, however, primary power signal PRI_IN and/or alternate power signal ALT_IN may provide insufficient power to operate base station 100. Accordingly, base station 100 may also include a battery circuit, as discussed below.

Wireless devices 197-199 may include virtually any devices for communicating over a wireless network. For example, wireless devices 197-199 may include mobile telephones (e.g., cellular telephones, GSM telephones, TDMA telephones, LTE telephones, etc.), wireless data devices (e.g., Personal Digital Assistants (PDAs), computers, pagers, etc.), and/or the like.

One skilled in the art will appreciate that although illustrated in the context of a wireless telecommunications environment, the invention may be practiced in any environment in which backup power serves a commercial, public, or private operation or system reliant upon electrical power.

Figure 2:
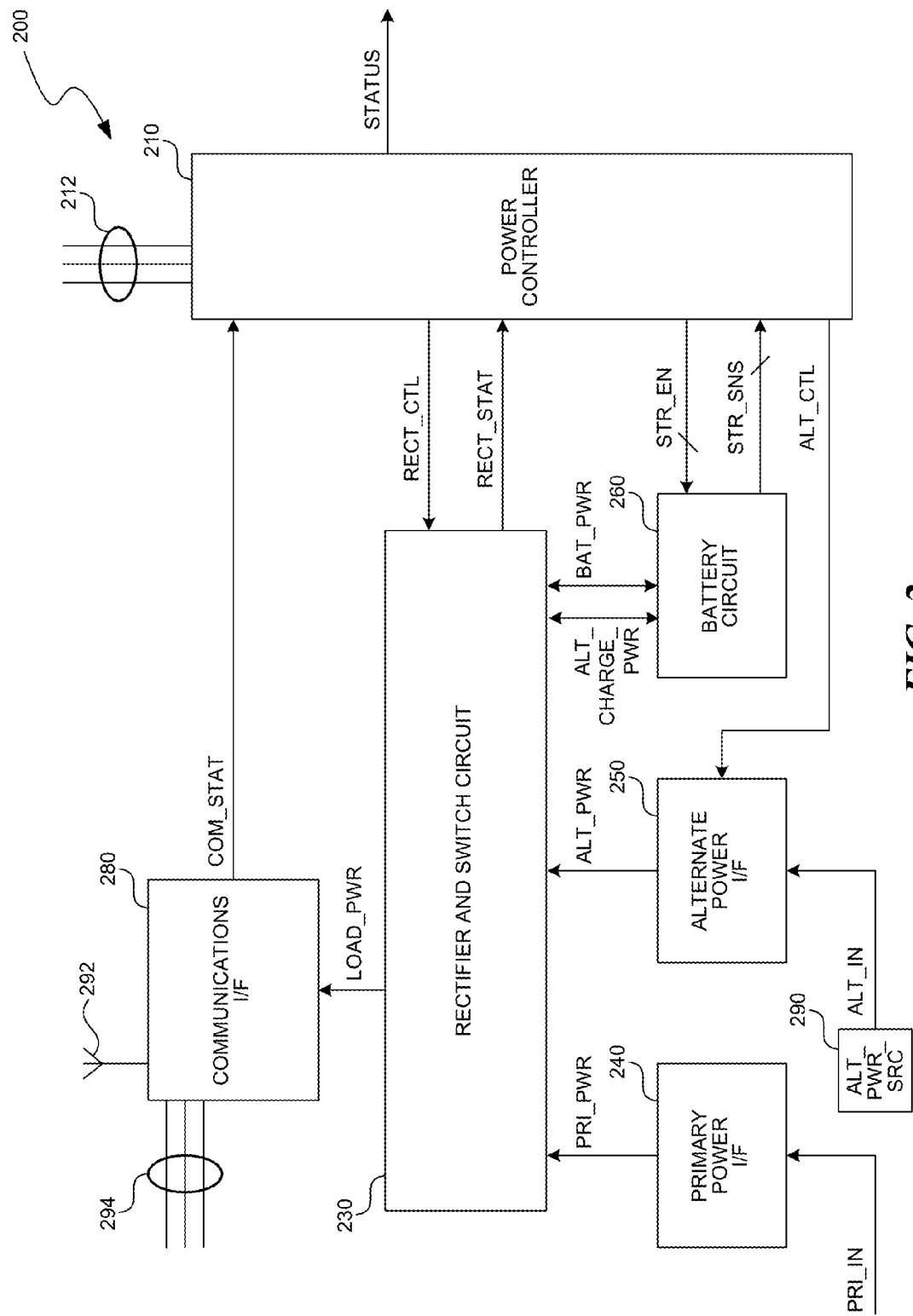
FIG. 2 is a block diagram of a suitable base station for use in the environment of FIG. 1.

FIG. 2 is a block diagram of a portion of base station 200. Base station 200 includes power controller 210, rectifier and switch circuit 230, primary power interface 240, alternate power interface 250, battery circuit 260, alternate power source 290, and communications interface 280. Base station 200 may be employed as an embodiment of base station 100 of FIG. 1.

In some examples, base station 200 includes an alternate power source 290 that is configured to provide power via alternate power signal ALT_IN and may include any of the example alternate energy power sources described previously with respect to FIG. 1. For example, alternate power source 290 may comprise photovoltaic power sources (e.g., solar panels or arrays) arranged on the exterior of base station 200.

Power controller 210 is configured to control the power systems of base station 200. As illustrated, power controller 210 is configured to receive or provide control signals 212, to receive status signals COM_STAT, RECT_STAT, and STR_SNS, and to provide output/control signals RECT_CTL, ALT_CTL, STR_EN, and STATUS, as discussed below.

Power controller 210 is also configured to manage and control the operation of rectifier and switch circuit 230 and battery circuit 260 based, at least in part, on the various status and control signal inputs. For example, when a primary power signal is available to the system, power controller may utilize control signals RECT_CTL and STR_EN to coordinate the charging and/or testing of battery circuit 260. When a primary power signal PRI_IN and/or alternate power signal ALT_IN fails (e.g., during an external power outage), power controller may utilize control signals RECT_CTL and STR_EN to route battery power from battery circuit to communications interface 280 and/or power controller. The operation of power controller 210 is discussed in further detail with regards to FIG. 3.

Rectifier and switch circuit 230 is configured to selectively route power between and/or among primary power interface 240, alternate power interface 250, battery circuit 260, communications interface 280, and power controller 210. For example, rectifier and switch circuit 230 may be configured to selectively power communications interface 280 from one of primary power interface 240, alternate power interface 250, and/or battery circuit 260. In addition, rectifier and switch circuit 230 may be further configured to route operational power to power controller 210 (power connection line not shown).

Rectifier and switch circuit 230 may be configured to provide status signal RECT_STAT to power controller 210 to, for example, indicate the status of rectifiers, inverters, chargers, switches, power source outputs, failure conditions (e.g., rectifier failure, inverter failure, switch failure, excessive current draw, out of range inputs/outputs, etc.), and/or the like. Status signal RECT_STAT may be provided to power controller 210 to enable power controller 210 to adjust the operation of rectifier and switch circuit 230 based on these and other conditions such as the status of primary power signal PRI_IN, the status of alternate power signal ALT_IN, and/or the like. Power controller 210 may control the rectification, switching, charging, and other operations of rectifier and switch circuit 230 via control signal RECT_CTL.

Rectifier and switch circuit 230 may include switching devices of any type (e.g., field-effect transistors, insulated gate bipolar transistors, junction field-effect transistors, bipolar-junction transistors, relays, transmission gates, etc.) that are configured to selectively switch (e.g., route) power among the elements of base station 200. In addition, rectifier and switch circuit 230 may also include one or more rectifiers configured to rectify AC power from primary power interface 240 and/or from alternate power interface 250 to provide DC power to communications interface 280, battery circuit 260, and/or power controller 210.

Further, rectifiers, switches, and/or other circuitry of rectifier and switch circuit 230 may be configured to selectively charge battery circuit 260 from primary power interface 240 and/or alternate power interface 250. For example, rectifier and switch circuit 230 may include and/or be configured as a trickle charger, a constant current charger, a constant voltage charger, a constant current/constant voltage charger, a delta-V charger, and/or the like and/or a combination of these.

Primary power interface 240 may be configured to couple primary power signal PRI_IN to rectifier and switch circuit 230 via power signal PRI_PWR, for example, to power communications interface 280, to charge battery circuit 260, and/or the like. Primary power interface 240 may include a circuit breaker, line filter, surge protector, power meter, and/or the like. However, in one embodiment, primary power interface 240 may simply be a wire segment connecting primary power signal PRI_IN to rectifier and switch circuit 230.

Likewise, alternate power interface 250 may be configured to receive power from an alternate energy source and to couple the received power to rectifier and switch circuit 230 via power signal ALT_PWR. For example, alternate power interface 250 may be configured to receive DC power from a photovoltaic power source and/or from a generator. As one example, alternate power interface 250 may be interfaced to a generator as discussed in further detail by U.S. patent application Ser. No. 12/170,675, entitled "CELL SITE POWER GENERATION," filed on Jul. 10, 2008, which is hereby incorporated by reference. In other examples though, alternate power interface 250 may be configured to receive power from virtually any power source, such as those discussed above.

Alternate power interface 250 may include a circuit breaker, line filter, surge protector, power meter, and/or the like. However, alternate power interface 250 may simply be a wire segment connecting alternate power signal ALT_IN to rectifier and switch circuit 230. Alternate power interface 250 may also be configured to receive control signal ALT_CTL, which may be employed, for example, to control an alternate power source.

Battery circuit 260 is configured to store power provided by primary power interface 240 and/or alternate power interface 250 in any number of batteries or other electrical energy storage devices (e.g., ultracapacitors, supercapacitors, other capacitors, inductors, etc.), which may be arranged in any combination of series configurations, parallel configurations, and/or series and parallel configurations. In one embodiment, battery circuit 260 includes multiple strings of serially connected batteries. As illustrated, battery circuit 260 is coupled to rectifier and switch circuit 230 via battery power signal BAT_PWR and in some examples, via alternate charging signal ALT_CHARGE_PWR. Battery circuit 260 is also coupled to power controller 210 via string enable signals STR_EN and string sense signals STR_SNS. Further details regarding battery circuit 260 are discussed in conjunction with FIG. 4, below.

Communications interface 280 is configured to interface wireless devices to back-haul 294 via antenna 292. Communications interface 280 typically includes both digital and radio frequency (RF) electronics. In one embodiment, communications interface 280 includes an RF transceiver and digital control circuitry. However, other components may also be associated with a transceiver and/or other circuits. Communications interface 280 is powered from rectifier and switch circuit 230 via line LOAD_PWR and is configured to provide status signal COM_STAT to indicate an operational status such as failure of back-haul 294, the number of wireless devices associated with base station 200, power consumption data, and/or the like.

Power Controller Examples

Figure 3:
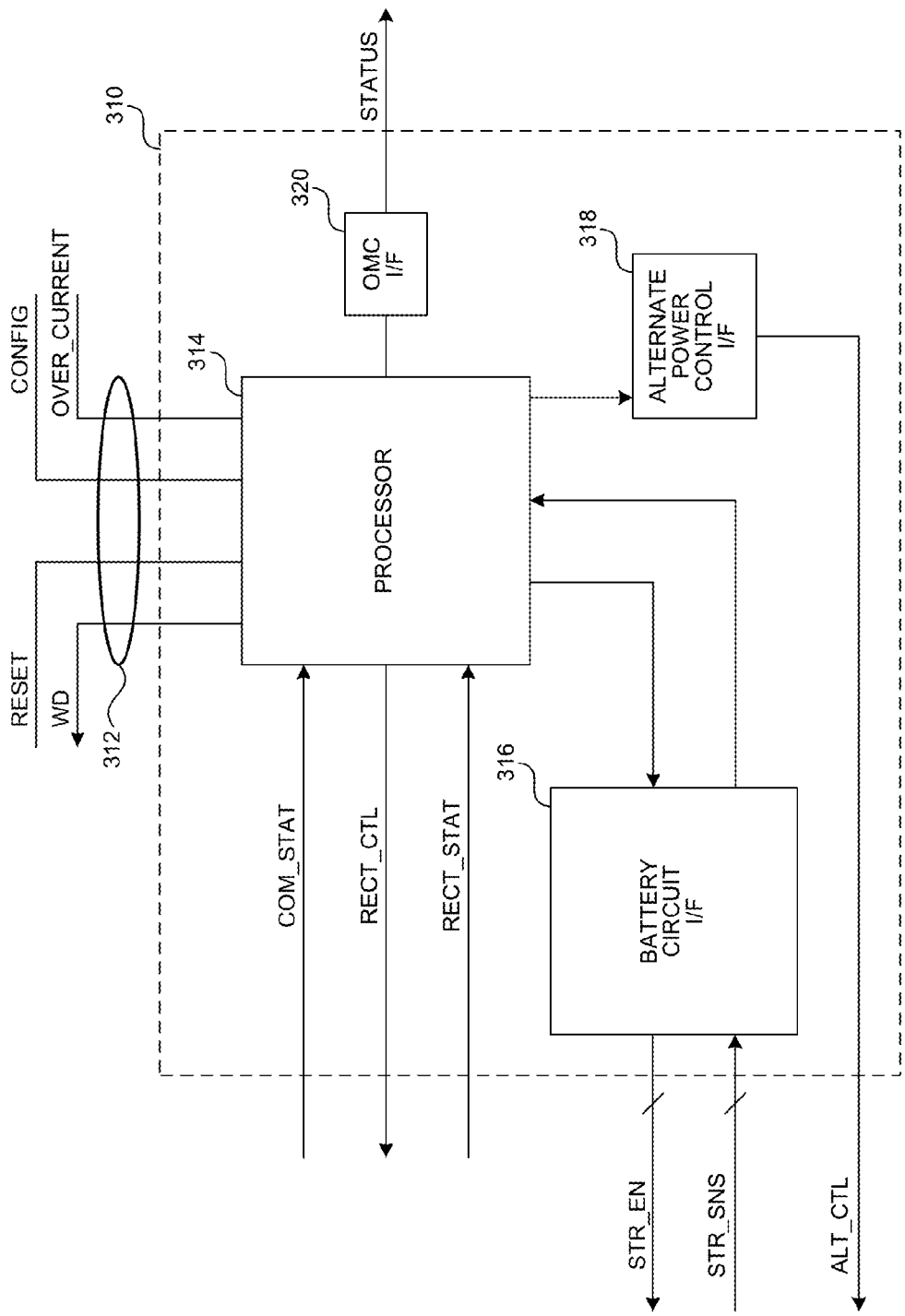
FIG. 3 is a block diagram of a suitable power controller usable in the base station of FIG. 2.

FIG. 3 is a block diagram of power controller 310. Power controller 310 includes processor 314, battery circuit interface 316, alternate power control interface 318, and operation, management, and control (OMC) interface 320, and may be configured to receive or provide control signals 312. Power controller 310 may be employed as an embodiment of power controller 210 of FIG. 2.

As illustrated, processor 314 is configured to control the operations of a rectifier and switch circuit (e.g., via control signal RECT_CTL) and an alternate power interface (e.g., via alternate power control interface 318 and control signal ALT_CTL). Processor 314 is further configured to provide a status signal to a remote system (e.g., via OMC interface 320 and status signal STATUS). In addition, processor 314 may also be interfaced to a battery circuit (e.g., via battery circuit interface 316, string sense signals STR_SNS, and string enable signals STR_EN) to control the operations of battery circuit, including selective switching, charging, testing, and power failure handling of battery strings within a battery circuit as described in greater detail herein.

As illustrated, processor 314 is also configured to provide watchdog signal WD to a watchdog circuit (not shown). The watchdog circuit may be arranged to reset the processor via the RESET signal if, for example, the watchdog signal WD remains unchanged for a predefined duration. In other embodiments, internal watchdog circuits, and/or the like, may also be employed.

Processor 314 is further configured to receive configuration signal CONFIG to represent a hardware configuration, to set various threshold levels, and/or the like. Any number of configuration signals may be provided. In one embodiment, configuration signals are employed to represent the number and/or types of rectifiers in the rectifier and switch circuit, the type of alternate power source coupled to the alternate power interface, the number of battery strings in the battery circuit, the types of batteries in the battery circuit, the capacities of batteries in the battery circuit, and/or the like. As another example, a configuration signal may be provided to indicate the load capacity of the rectifiers so that processor 314 may more accurately determine the number of active rectifiers for providing efficient rectification. As yet another example, a configuration signal may be provided to indicate the design voltage of the battery circuit so that processor 314 may more accurately estimate the charge on the battery circuit from the battery circuit output voltage.

Configuration signal CONFIG may be provided from a switch (e.g., a DIP switch), from pull-up resistors, from pull-down resistors, from jumpers, and/or the like. Alternatively, similar configuration information may be read by processor 314 from a memory or be received from another processor.

Processor 314 is also configured to receive various status signals as illustrated in FIG. 3. For example, signals COM_STAT and RECT_STAT may be employed to respectively represent the status of the communications interface and of the rectifier and switch circuit. Likewise, signal STR_SNS may be employed to represent conditions of each of the strings of the battery circuit. Also, signal RESET may be employed to reset and/or hold processor 314 in reset. Finally, control signal OVER_CURRENT may be employed to represent an over-current condition of the battery circuit, of the rectifier and switch circuit, and/or the like.

Processor 314 may be a microprocessor, a microcontroller, a digital signal processor (DSP), and/or the like. However, in other embodiments, digital logic, analog logic, combinations of digital logic and analog logic, and/or the like may also be employed instead of a processor. For example, such embodiments may be implemented in a field-programmable gate array (FPGA), in an application-specific integrated circuit (ASIC), in other programmable logic devices (PLDs), and/or the like.

Battery circuit interface 316 is configured to interface processor 314 to a battery circuit 260 of FIG. 2. For example, battery circuit interface 316 interfaces string sense signals STR_SNS from battery circuit 260 to processor 314 (e.g., to sense conditions of each string of battery circuit 260) and interfaces power controller 310 to string enable signals STR_EN (e.g., to select which strings of battery circuit 260 are coupled to rectifier and switch circuit 230). For example, battery circuit interface 316 may include multiplexers, drivers, buffers, logic gates, analog circuits, and/or other logic or circuitry to perform sampling, multiplexing, demultiplexing, conversion, and/or the like. As one example, battery circuit interface 316 includes an array of analog to digital converters (ADCs) that are configured to digitize each of string sense signals STR_SNS and drivers configured to drive each of string enable signals STR_EN.

Alternate power control interface 318 is configured to interface processor 314 to alternate power interface 250 of FIG. 2. In one embodiment, alternate power control interface 318 includes a relay, a level-shifter, a driver, a buffer, an inverter, logic gates, and/or the like that are configured to provide control signal ALT_CTL based, at least in part, on the output of processor 314.

OMC interface 320 is configured to interface processor 314 to a remote system and to provide operational data regarding the base station and/or the base station power system to the remote system. OMC interface 320 may include drivers, buffers, inverters, logic gates, network interface units, multiplexers, and/or the like. Likewise, OMC interface 320 may be configured to multiplex the STATUS signal onto the back-haul or may provide the STATUS signal as a discrete signal.

Battery Circuit Examples

Figure 4:
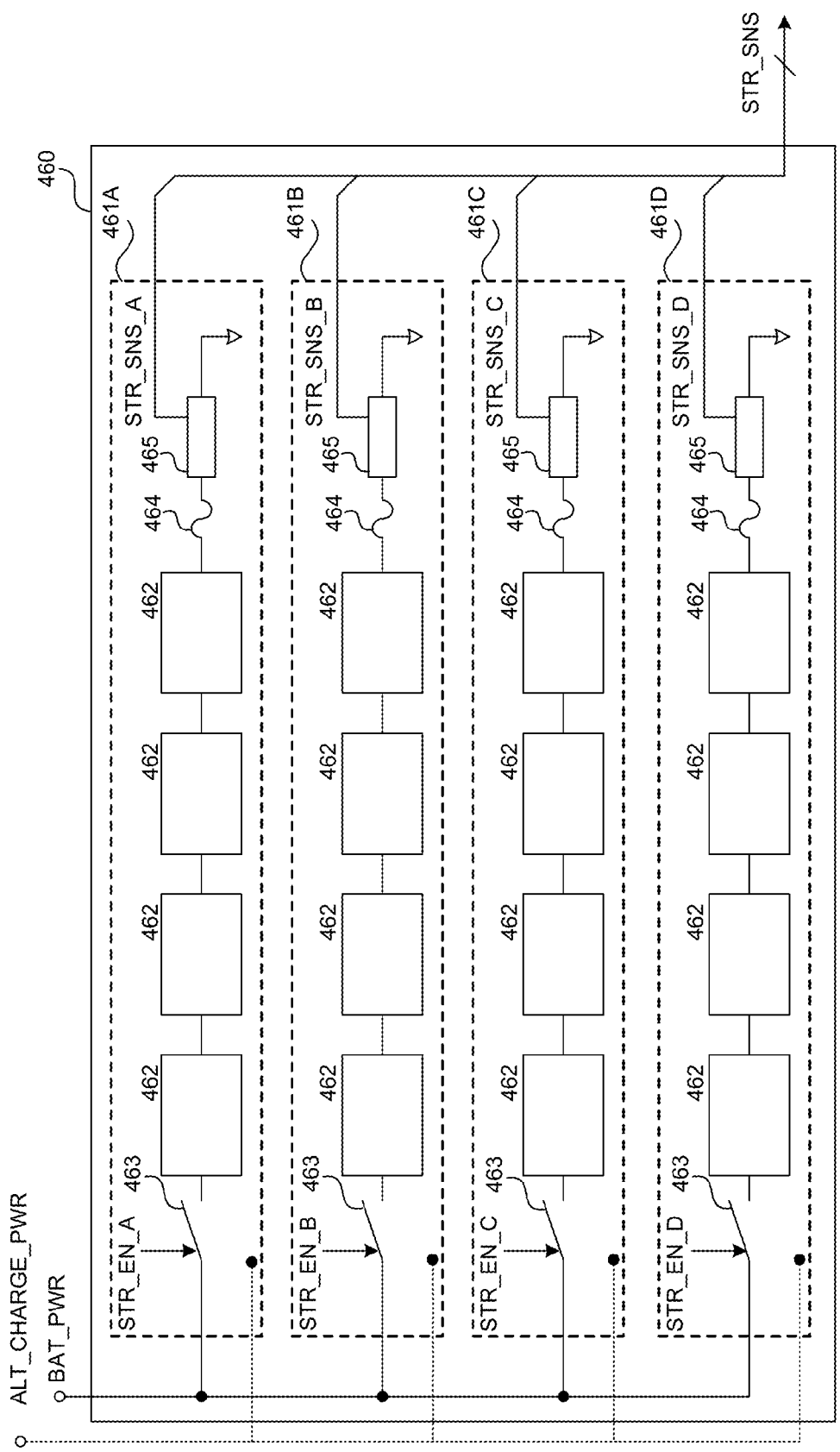
FIG. 4 is a schematic diagram of a suitable battery circuit usable in the base station of FIG. 2.

FIG. 4 is a schematic diagram of a suitable battery circuit 460. As illustrated, battery circuit 460 includes four battery strings 461A-461D. Each battery string in turn comprises a string connection switch 463, one or more batteries 462, a fuse 464, and a sensor 465. Although four battery strings are shown, two or more battery strings may be employed in battery circuit 460. Battery circuit 460 may be employed as an embodiment of battery circuit 260 of FIG. 2.

As discussed above with respect to FIG. 1, battery circuit 460 may be employed in systems other than the base station or other communications systems of FIGS. 1-3. For example, battery circuit 460 may be employed in, or with, any system employing a backup or other battery circuit.

As shown, a battery string 461 comprises two or more batteries 462 arranged in a serial fashion. Although FIG. 4 shows four batteries 462 per battery string, any number of batteries may be employed per battery string, and the various battery strings in a battery circuit 460 may comprise different numbers of batteries per battery string. In one example, each battery string has four serially connected batteries that together form a negative 48 volt (V) string that has an approximate suitable float voltage of 54 V. In one implementation, a battery string 461 comprises serially connected absorbed glass mat (AGM) batteries that are sealed valve-regulated, such as the SBS-S series or VRLA batteries available from Storage Battery Systems® Inc. In another implementation, a battery string 461 comprises serially connected carbon nanotube (CNT) batteries. However, other batteries and/or energy storage devices such as other types of AGM batteries, gel cell batteries, other deep cycle batteries, flooded lead-acid batteries, nickel-metal-hydride batteries, nickel-cadmium batteries, lithium-ion batteries, lithium-polymer batteries, alkaline batteries, capacitors, and/or the like, may also be suitably employed.

Each battery string 461 comprises a string connection switch 463 configured to selectively connect and disconnect the one or more serially connected batteries 462 in the battery string to a battery circuit node carrying the battery power signal BAT_PWR. As shown, a string connection switch is controlled by a string enable signal STR_EN (e.g., the string connection switch of battery string 461A is controlled by the string enable signal STR_EN_A). As described previously, the battery circuit node carrying battery power signal BAT_PWR may be connected to a rectifier and switch circuit 230 to route battery power to communications interface 280 or other loads and/or to charge one or more battery strings (e.g., from primary power interface 240). Thus the string connection switches 463 permit individual battery strings 461A-461D to be selectively discharged and/or charged via various string enable signals STR_EN. A string connection switch 463 may be implemented by a switching device of any type (e.g., field-effect transistors, insulated gate bipolar transistors, junction field-effect transistors, bipolar-junction transistors, relays, transmission gates, etc.).

During a particular time period, one or more battery strings 461 may be maintained as an "active" string and one or more other strings may be maintained as a "parked" string. Active strings are connected to the battery circuit node and maintained regularly (e.g., daily) or continuously with a charging float voltage source or other type of maintenance source suitable for maintaining the active strings at or near full charge. Unless a specified charging, testing, or power failure event occurs, parked strings are strings of batteries that remain disconnected from the battery circuit node and the floating voltage source. Parked strings are thus typically charged less frequently than active strings (e.g., on an "as-needed" basis when their voltage and/or estimated charge falls below a threshold value) and thus may be only partially charged at a given time (e.g., charged to 95% capacity).

Power controller 210 may determine a suitable number of battery strings 461 to maintain in active status based on factors such as the estimated peak and/or average power needed by battery loads such as the telecommunication interface, cooling system (not shown), and power controller; the voltages of various battery strings; the estimated and/or expected capacity of the various battery strings; the estimated or measured charging, discharging, and self-discharge rates of the various strings; and/or the condition of the various strings (e.g., if they have failed during prior testing). For example, power controller 210 may choose to maintain enough active strings to satisfy the peak power demands imposed by a telecommunications interface and associated cooling system. In the example, power controller 210 may maintain more battery strings in active status during summer months, when a cooling system requires more power.

Since the various battery strings 461 are individually connectable/disconnectable, power controller 210 may rotate a given battery string into and out of active service. Power controller 210 may rotate batteries on the basis of numerous factors including a fixed amount of time; the voltages of various battery strings; the estimated or measured discharge level of the various battery strings; the estimated peak and/or average power needed by battery loads such as the telecommunication interface, cooling system, and power controller; the estimated and/or expected capacity of the various battery strings; the estimated or measured charging, discharging, and/or self-discharging rate of parked strings; and/or the condition of the various strings, including cumulative time in active service.

Rotating strings may result in many benefits. By rotating strings the system reduces unnecessary charging, resulting in lower power expenditures and less heat in the battery compartment. Also, each string may spend less time on a float voltage source, so the average battery life may increase, and batteries are less likely to become unbalanced. The system may test batteries without discharging the batteries, which also improves the average life of the batteries. Finally, the system may remotely test the various battery strings and, when strings fail, simply send an alert and rotate alternate strings into active service, thus reducing the need for service calls.

When a new battery string 461 or battery 462 is deployed within a battery circuit 460, the power controller 210 may record the time and/or date of deployment in an index or other data structure that correlates deployment times, failure times, applicable warranty periods, serial numbers, and/or other similar information. Alternatively, or additionally, power controller 210 may send this information to a remote monitoring location. In this way, power controller 210, via regular testing of the battery strings 461, may detect when a battery string 461 or a battery 462 failure indicates that a warranty remedy is available (e.g., a free replacement battery, free service, a refund, etc.) and may take steps towards claiming any warranty remedy (e.g., by notifying a remote monitoring location of the warranty remedy and/or otherwise).

In an illustrative implementation, battery circuit 460 comprises ten battery strings A-J. In one example, string A may be active for May, then string B may be active for June, and in July, due to higher cooling requirements, strings C and D are active, and so on. In a second example, string A may be active until parked strings B-J require charging, e.g., because a parked string voltage indicates that the parked string has fallen below a threshold charge (e.g., 95% charge). In the second example, at the completion of a charging of strings B-J, string A may then be rotated from active status to parked status and string B may be rotated from parked status to active status.

Although only a subset of active strings are maintained at a given time, during a power failure, power controller may selectively press the partially charged parked strings into service to provide additional power to communications interface 280 and/or other battery loads.

When power controller 210 connects a parked string to the battery circuit node (e.g., for rotation, for as-needed charging, or during a power failure), it must ensure that the parked string has approximately the same voltage as other battery strings that are already connected to the node. Otherwise arcing and/or other dangerous conditions might result from the mismatched batteries. Thus, as described herein, power controller may actively adjust or wait for the voltages of connected battery strings to reach or "intercept" the voltage of a parked string before connecting the parked string.

In some examples, string connection switch 463 may be a multi-position switch configured to also selectively connect and disconnect the one or more serially connected batteries 462 in a battery string 461 to an alternate charging circuit node carrying the alternate charging signal ALT_CHARGE_PWR. In such examples, string connection switch 463 may be utilized to selectively couple a parked battery string to the alternate charging signal so that the parked battery string may be charged using an alternate energy power source such as alternate power source 290. In some implementations, under the direction of power controller 210, rectifier and switch circuit 230 may route power generated by alternate power source 290 that exceeds the operational needs of the base station (e.g., output that is higher than that needed by communications interface 280 or another load) over the ALT_CHARGE_PWR signal to one or more parked battery strings so that the parked strings may be charged by the excess power that might otherwise be wasted.

As shown, a battery string 461 also comprises a fuse 464 in series with batteries 462. Fuse 464 protects battery string, rectifier and switch circuit 230, a load of the battery circuit 460 (e.g., communications interface 280), and/or other system components from out-of-range or excessive currents. Fuse 464 may also permit power controller 210 to detect anomalous current conditions that occur in the string and/or test a battery string for failures. For example, power controller 210 may repeatedly reset a fuse to test a battery string. If the fuse repeatedly trips after these resets, power controller 210 may determine that the battery string has failed and take steps, such as holding the fuse open and/or sending a failure notification.

Fuse 464 may be implemented with any suitable fuse, breaker, or any other type of device having a suitable break/trip point, tolerance, etc. In one implementation, fuse 464 may be a breaker capable of being reset via an electrical control signal. For example, fuse 464 may be a motorized or other remotely resettable on/off breaker controllable by a control signal that does not require power flowing through a battery string to hold its position. In some implementations, a motorized breaker used as a fuse 464 may have a "Z" shaped profile. Although not shown in the Figures, power controller 210 may be communicatively coupled to a motorized breaker used as a fuse 464 so that power controller 210 may control the operation of the breaker via control signals. In still other implementations, fuse may be combined with string connection switch 463.

As shown, a battery string 461 also comprises a sensor 465. Although FIG. 4 shows a single sensor 465 connecting the batteries 462 and fuse 464 to a ground reference, more than one sensor may be employed in a battery string and/or a sensor may be located at another location in the battery string (e.g., farther from ground reference). In some implementations, sensor 465 is a current sensor (e.g., sense resistor, Hall effect sensor, current shunt, optoisolator, ADC, etc.) to enable monitoring of instantaneous current. However, sensor 465 may also include or be a voltage sensor and/or power sensor to enable monitoring of instantaneous voltage, power, or both. Sensor 465 may also implement various operations, such as averaging, integrating, differentiating, and/or the like to estimate or calculate other values such as average power, average current, expended charge, remaining charge, etc. in a battery string.

As shown, sensor 465 provides a string sense signal STR_SNS, which as described previously may be input to power controller 210. For example, string sense signals STR_SNS may be employed to indicate the output voltage of the battery strings 461A-461D, the output voltage of an individual battery 462 within a battery string 461, an input/output (I/O) current, I/O power, and/or the like. Power controller 210 may be configured to determine conditions relating to the state of battery circuit 460 and/or its components from string sense signals STR_SNS. For example, power controller 210 may be configured to evaluate and/or analyze the string sense signals STR_SNS to determine failure conditions (e.g., failed batteries or failed battery strings); the open or closed state of fuses 464; the approximate charge level of a battery 462, battery string 461, and/or battery circuit; the output voltage of a battery and/or battery string, and so forth. Information from sensors 465 and conveyed by string sense signals STR_SNS may be employed by power controller 210 to perform processes such as those discussed below.

Although not shown, battery circuit 460 may additionally comprise one or more temperature sensors configured to provide measured temperatures in or near the battery circuit 460 to power controller 210 so that power controller 210 may calculate or adjust operating, charging, or testing values and/or other parameters that are temperature-dependent (e.g., suitable float voltages, charging voltages or currents, estimated battery charge, etc.).

Although particular aspects of battery circuit 460 are illustrated and described herein, other battery circuits may differ in any number of aspects. For example, other battery circuits may include additional and/or different elements, be configured in other configurations, provide and/or enable additional and/or other functionality, and/or the like. Other suitable battery circuits may be as described in U.S. application Ser. No. 12/365,165, entitled "BATTERY MONITORING SYSTEM, SUCH AS FOR USE IN MONITORING CELL SITE POWER SYSTEMS," filed on Feb. 3, 2009, which is hereby incorporated by reference.

Example Processes

Figure 5:
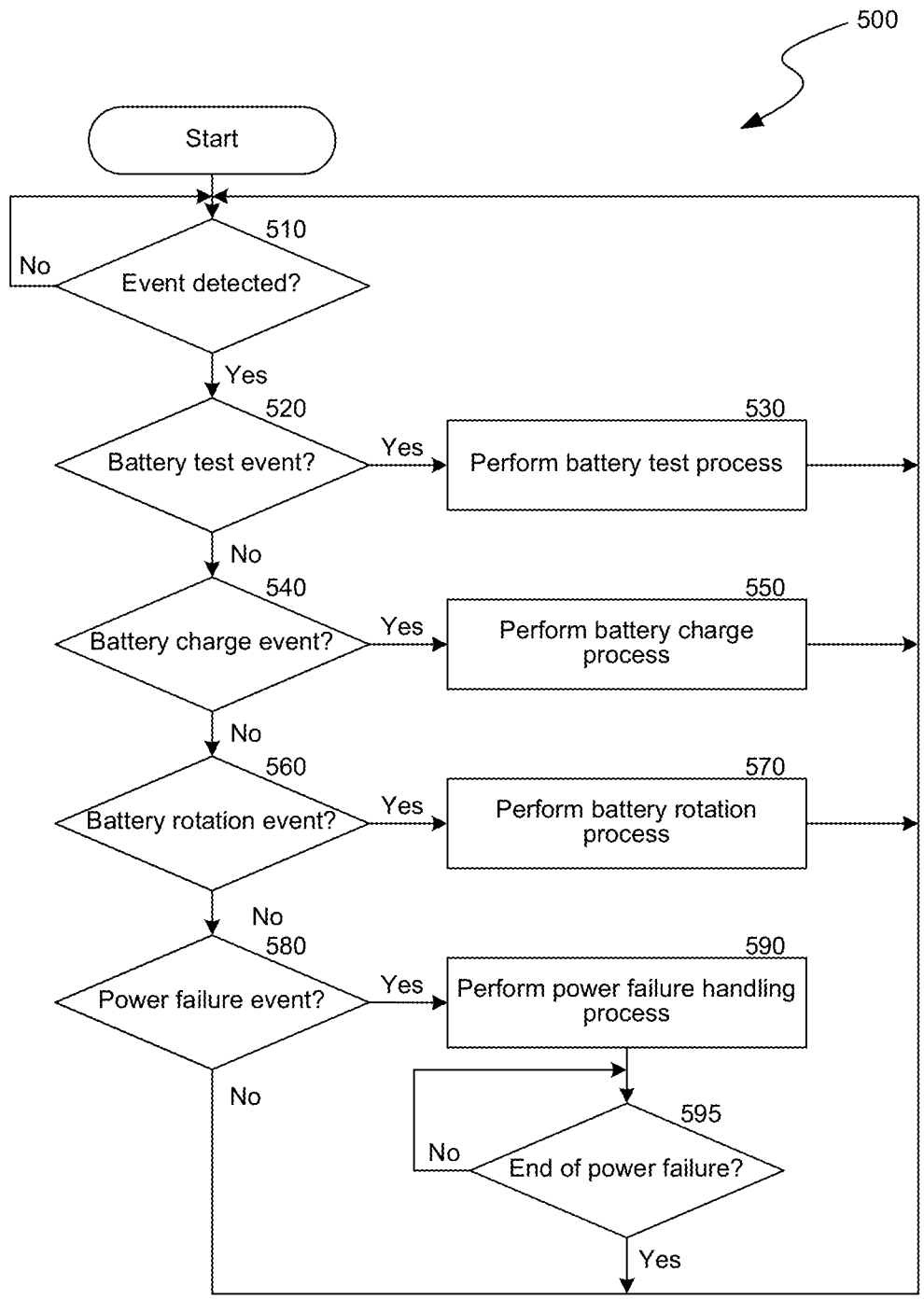
FIG. 5 is a logical flow diagram of a suitable process for managing a battery circuit.
Figure 6:
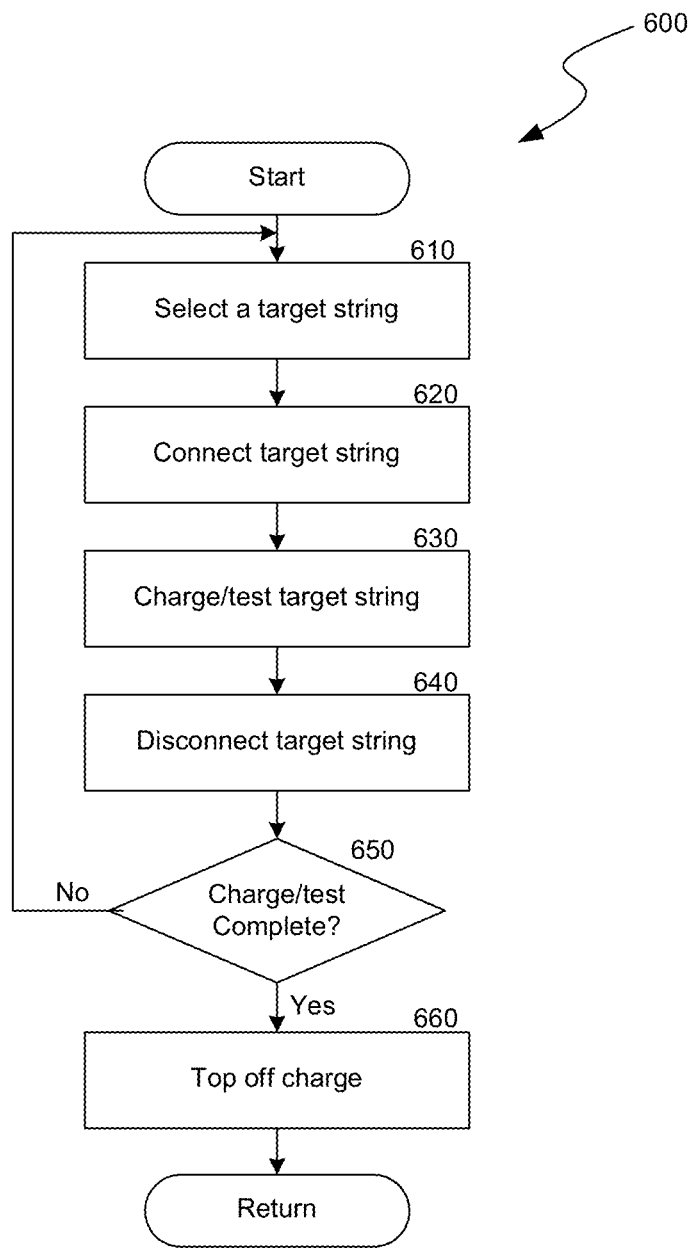
FIG. 6 is a logical flow diagram of a suitable process for charging and/or testing a battery circuit.
Figure 7:
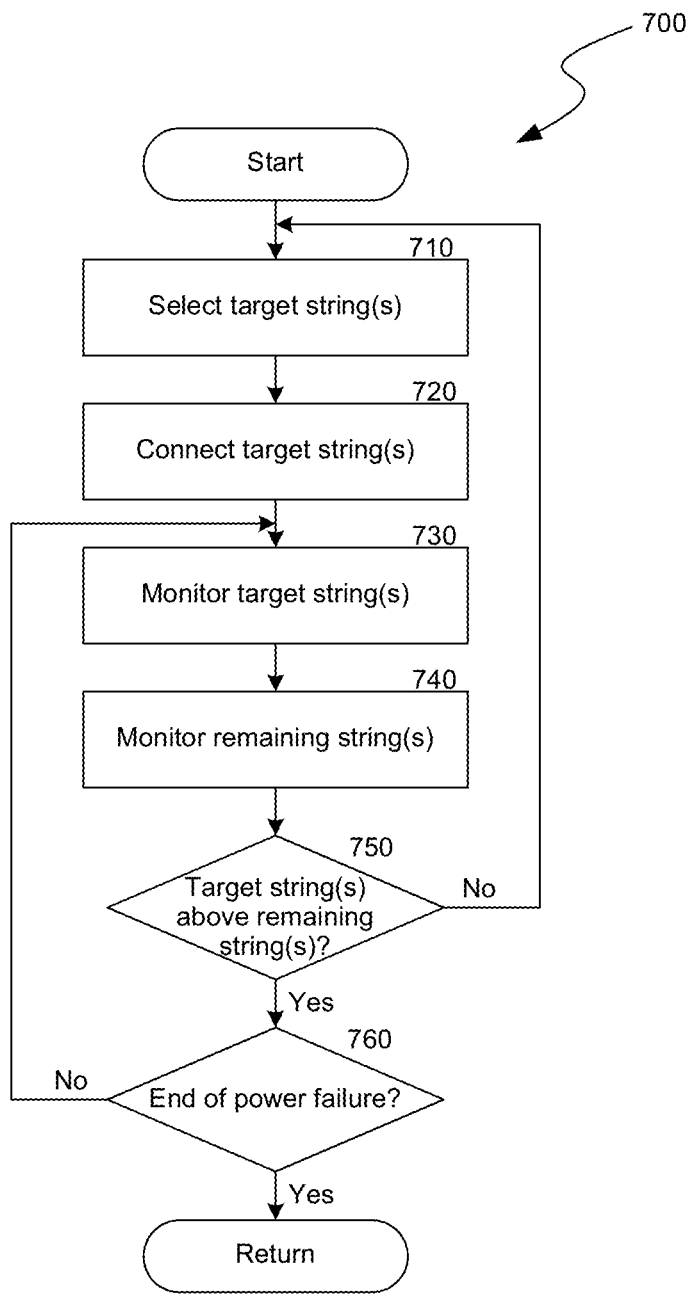
FIG. 7 is a logical flow diagram of a suitable process for handling a power failure.

FIG. 5 is a logical flow diagram of process 500 for managing a battery circuit, FIG. 6 is a logical flow diagram of process 600 for charging and/or testing a battery circuit, and FIG. 7 is a logical flow diagram of process 700 for handling a power failure. Each of these Figures will now be discussed in detail. For clarity, processes 500, 600, and 700 are described below as being performed by power controller 210 of FIG. 2. However, processes 500, 600, and 700 may also be performed by power controller 310 of FIG. 3 or its processor 314, another component of base station 100, or another remote component or remote monitoring location.

Processes 500, 600, and 700 may also be performed by other processors, by other components, or in other systems, whether or not such processors, components, or systems are described herein. Processes 500, 600, and 700 may also be embodied on processor and/or computer readable media such as non-volatile memory, volatile memory, and/or the like. These flow diagrams do not show all functions or exchanges of data, but instead they provide an understanding of commands and data exchanged under the system. Those skilled in the relevant art will recognize that some functions or exchange of commands and data may be repeated, varied, omitted, or supplemented, and other (less important) aspects not shown may be readily implemented.

Aspects of the invention may be stored or distributed on tangible or non-transitory computer-readable media, including magnetically or optically readable computer discs, hard-wired or preprogrammed chips (e.g., EEPROM semiconductor chips), nanotechnology memory, biological memory, or other data storage media. Alternatively, computer implemented instructions, data structures, screen displays, and other data under aspects of the invention may be distributed over the Internet or over other networks (including wireless networks), on a propagated signal on a propagation medium (e.g., an electromagnetic wave(s), a sound wave, etc.) over a period of time, or they may be provided on any analog or digital network (packet switched, circuit switched, or other scheme).

The process 500 of FIG. 5 begins at decision block 510, where power controller 210 determines whether it detected an event that requires further action by power controller 210. To make the determination, power controller 210 may perform internal calculations, access stored or set values, and/or evaluate various received control signals, input signals, and status signals, including reset signal RESET, configuration signal CONFIG, control signal OVER_CURRENT, and status signals COM_STAT, RECT_STAT, and STR_SNS. If power controller 210 does not detect an event that requires further action, it repeats block 510 by continuing to monitor for events. Otherwise process 500 proceeds to block 520.

Several types of events may require further action by power controller 210. As a first example, power controller may determine that one or more battery strings or batteries reached a predetermined threshold voltage, estimated charge or discharge, instantaneous or average I/O current, instantaneous or average I/O power, etc. To illustrate, power controller 210 may determine that a parked battery string reached or fell below a threshold voltage, indicating a need for charging and/or testing of the battery circuit 260. As a second example, power controller may determine that a fuse 464 tripped, e.g., indicating an excessive or anomalous current in a battery string. As a third example, power controller may determine that the present time and/or date requires additional scheduled action. As an illustration, power controller 210 may determine that it is an "off-peak" time when power rates are lower or cheaper and thus an appropriate time to charge the battery circuit. As another illustration, power controller may determine that a specified number of days has elapsed since power controller last charged the battery circuit. As a fourth example, power controller may determine that primary power and/or alternate power sources failed. As a fifth example, power controller may determine that primary power and/or alternate power came back online after a failure. As a sixth example, some combination of previous examples may occur (e.g., a battery string may reach a threshold voltage and it may be an off-peak time suitable for charging). These examples are intended to be illustrative, not exhaustive and are discussed in greater detail herein.

At decision block 520, power controller 210 determines whether the detected event indicates that power controller should test the battery circuit for failures, damage, or other undesirable conditions (e.g., unbalanced batteries). If a battery test event occurs, process 500 proceeds to block 530, where power controller 210 performs a battery test process, and then process 500 repeats starting at block 510. Otherwise, process 500 proceeds to block 540. The type of test process performed at block 530 may depend on the event that triggered testing.

Power controller 210 may determine that it should perform testing using the present state of one or more battery strings as determined by the status signals STR_SNS. As a first example, power controller may determine that testing is required if it estimates that the total charge remaining in battery circuit 260 falls below a threshold value; it may estimate the total charge by evaluating the output voltages of the battery strings and/or other parameters such as the temperature and/or type of battery used. As a second example, power controller may determine that it should perform testing if the voltage of a parked battery string (or parked battery) reaches or falls below a threshold voltage. In some implementations, power controller may set a threshold voltage by first calculating a baseline voltage for the battery string based on the type of batteries in the string, the temperature of the battery compartment or other environmental conditions, and/or the time elapsed since the string was last fully charged, and then setting the threshold as a particular percentage of the determined baseline voltage. In some examples, power controller uses a float voltage suitable for the present conditions as the baseline voltage. For example, in some implementations, the threshold value may be chosen as 98% of a suitable float voltage. Alternatively, power controller may set the threshold voltage to a value that corresponds to a particular level of estimated charge stored in a battery string. To calculate a threshold voltage in such implementations, power controller may evaluate the type of batteries in the string, the temperature of the battery compartment, and/or other environmental conditions. For example, power controller may set a threshold voltage that corresponds to the battery string having approximately 98% of its total charge capacity.

In other examples, power controller 210 may determine that it should perform testing if a fuse 464 trips, which indicates unusual current or other conditions in a battery string. Power controller 210 may also initiate testing if string sense signals STR_SNS indicate an anomalous current profile in a battery string. For example, power controller 210 may initiate testing if a charging or discharging current for a battery string is unusual, e.g., significantly higher or lower than those seen in other strings or as compared to a reference value. As yet another example, power controller may initiate testing if it determines that a periodic or nonperiodic scheduled testing is due (e.g., a testing mandated by an applicable policy or configuration setting). Power controller 210 may trigger testing if it determines that the primary power and/or alternate power came back online after a failure, and thus, the battery circuit should be tested to ensure that it was not damaged or otherwise compromised during the power failure.

FIG. 6 describes one suitable battery test process that may be performed at block 530 in tandem with battery circuit charging 550. Power controller 210 may perform the process of FIG. 6 when power controller 210 determines that one or more parked battery strings have a voltage below a threshold voltage, at a predetermined time (e.g., at the beginning of an off-peak time), or when a combination of these events occur (e.g. when a parked battery string has a voltage below a threshold voltage and it is an off-peak time).

Alternatively, or additionally, power controller 210 may perform other battery circuit testing procedures at block 530. For example, if a mechanically resettable fuse 464 (e.g., a resettable breaker) associated with a battery string trips to an open position, power controller 210 may wait a first predetermined amount of time before closing the breaker using a control signal and then determine whether the breaker remains closed for a second predetermined amount of time. Whether the power controller 210 determines that a mechanical fuse 464 repeatedly trips during a short time window (e.g., trips open three times in under 30 seconds), the power controller 210 may determine that its associated battery string is defective.

If power controller 210 determines that a battery string or battery is defective at block 530, it may report the defective string or battery to a remote monitoring location (e.g., by sending a message via OMC interface 320 using the STATUS signal) at which the error may be logged, a trouble ticket opened, a technician dispatched, a warranty remedy claimed, and/or the like. Power controller may also take other actions, such as disconnecting the defective string from the battery circuit node using a string enable signal STR_EN, updating power controller's hardware configuration (e.g., to indicate that the string is defective), determining whether a warranty remedy is available due to the failure (e.g., using an index or other data structure related to warranties as described previously and/or by querying a remote monitoring location), taking steps towards claiming an available warranty remedy, and/or other suitable actions.

At decision block 540, power controller 210 determines whether an event occurred that indicates that power controller should perform charging of the battery circuit. If a battery charging event occurs, process 500 first proceeds to block 550, where power controller performs a battery charging process, and then repeats starting at block 510. Otherwise, process 500 proceeds to block 560. Battery charging events include a scheduled charging event, the return of primary power and/or alternate power after a power failure, the remaining estimated charge in battery circuit (as determined from output voltages of the various battery strings) falling below a threshold value, and one or more battery strings or batteries reaching a threshold voltage (or other threshold value, e.g., threshold charge or I/O power) as described previously with respect to block 520.

FIG. 6 describes one suitable battery charging and testing procedure that may be performed at block 550. Any other suitable battery charging process may be performed at block 550, however, including charging processes that do not also implement testing. For example, power controller 210 may perform only the "top off" charging described with respect to block 660 of process 600.

At decision block 560, power controller 210 determines whether an event occurred that indicates that power controller should rotate the various battery strings. Rotation of battery strings comprises changing which battery strings are active and which are parked by using the string enable signals to connect one or more strings to the battery circuit node and/or to disconnect one or more other strings from the node. As described previously with respect to FIG. 4, power controller 210 may perform battery rotation when a predetermined period elapses or upon a specified schedule (e.g., after a particular battery string has been active for 30 days), when one or more battery strings reaches a particular state (e.g., after a parked battery string reaches a threshold voltage or other threshold value, or when an active string fails), in conjunction with testing and/or charging of the battery circuit, after a primary or alternate power source comes online after a failure, and/or upon the occurrence of other types of events.

If power controller 210 determines that a battery rotation event occurred, process 500 proceeds to block 570, where power controller performs a battery rotation process, and then repeats starting at block 510. Otherwise, process 500 proceeds directly to block 580. At block 570, power controller typically performs calculations, accesses stored or received configuration parameters, and evaluates string sense signals STR_SNS and other status signals in order to determine which battery strings should be connected and which strings should be disconnected during a rotation. As described previously with respect to FIG. 4, power controller 210 may evaluate several factors when selecting how many and which battery strings to rotate into active service; for brevity, those factors are not repeated here. In some implementations, power controller may implement a first-on, first-off approach to rotating battery strings that sequentially rotates in the various battery strings. In other implementations, power controller may replace an active string with whatever battery string has the lowest accumulated time in active service.

To rotate battery strings at block 570, power controller 210 may simply disconnect all currently active strings from the battery circuit node and then connect one or more currently parked strings to the node via string enable signals STR_EN. However, unless the connected battery strings are equalized, arcing or other undesired results will occur. Alternatively, power controller may instruct the rectifier and switch circuit 230 (e.g., via control signal RECT_CTL) to reduce the voltage provided to the node to a value below the voltages of the incoming strings that are to be rotated into an active state. When the voltage across the currently active strings intercepts an incoming string, the power controller may then connect the intercepted incoming string to the node using a string enable signal STR_EN. Once all the incoming strings are connected to the node in this manner, the power controller may then instruct the rectifier and switch circuit to raise the voltage provided to the node to a float value that is suitable for the type of batteries, the temperature of the batteries, and/or other conditions. Either before or after raising the voltage, power controller 210 may disconnect the previously active strings using string enable signals STR_EN.

In some examples, a single event may trigger a power controller to perform more than one of battery charging, testing, and/or rotation, resulting in the substantially simultaneous performance of blocks 530, 550, and/or 570. For example, power controller may initiate battery charging, testing, and rotation when the voltage of a parked battery string reaches or falls below a threshold voltage (e.g., a threshold voltage that indicates more than 98% discharge) and/or during an off-peak period.

At decision block 580, power controller 210 determines whether an external power source has failed, i.e., whether primary power signal PRI_IN and/or alternate power signal ALT_IN cannot provide sufficient power to operate communications interface 280 and/or power controller 210. Power controller 210 may perform this determination based on status signal RECT_STAT, a status signal from primary power interface 240, and/or the like. If a power failure occurs, process 500 proceeds to block 590, where power controller performs a power failure handling process and then repeats starting at block 510. Otherwise, process 500 directly repeats starting at block 510. When an external power source fails, power controller 210 may instruct rectifier and switch circuit 230 to route battery power from the battery circuit node to communications interface 280, power controller 210, and/or other loads. Suitable methods for performing power failure handling are described in greater detail with respect to FIG. 7.

At block 595, power controller 210 determines if the power failure has ended. If is has, process 500 repeats starting at block 510. Otherwise, process 500 repeats starting at block 590.

FIG. 6 is a logical flow diagram of a process 600 for charging and/or testing a battery circuit. Before process 600 begins, power controller 210 may maintain one or more active battery strings (e.g., 461A) in a floating state, at approximately a float voltage, while one or more parked strings (e.g., 461B, 461C, 461D) are disconnected from the battery circuit node. To do so, power controller 210 may maintain the connection of the active string(s) to the battery circuit node and, when primary and/or alternate power sources are available, instruct the rectifier and switch circuit 230 to provide a float voltage to the active strings (e.g., provide a voltage sufficient to keep the active strings at approximately full charge under present conditions, including the temperature in the battery circuit).

Table 1 shows example states of four battery strings prior to the process of FIG. 6. The example values shown in Table 1 will be referenced in further discussions herein to illustrate various concepts related to FIG. 6.

TABLE 1

Illustrative example of the state of four battery strings before process 600.

| String Name | Voltage | Connection Status | Charge Status |
|---|---|---|---|
| A | 54 V | Active | Charged |
| B | 52.2 V | Parked | Uncharged |
| C | 49.0 V | Parked | Uncharged |
| D | 48.5 V | Parked | Uncharged |

Table 1 provides just one example of starting states. In some other examples, prior to the process 600, the various battery strings may have very different states from those shown in Table 1. For example, if a recent power failure occurred, all of the strings may be active and/or may have roughly equal output voltages.

Process 600 begins at block 610, when power controller 210 selects a target string that the power controller will next charge and test. In some implementations, power controller 210 selects the parked string that is (1) as yet uncharged and (2) has the highest voltage among all of the parked and uncharged strings (e.g., in Table 1, string B). In other implementations, power controller may utilize any other suitable selection method.

Prior to block 620, power controller 210 may adjust the voltage and/or current applied to the battery circuit node so that the voltage across the active strings will eventually reach or "intercept" the voltage of the target string. To do so, in one implementation, power controller 210 may instruct rectifier and switch circuit 230, via control signal RECT_CTL, to reduce the voltage applied to the battery circuit node. In response to a lower applied voltage, the voltage of the active battery strings may drop, partly due to the active strings burning through surface charge. Power controller 210 may select the applied voltage based on the voltage of the target battery string, the voltage of the active strings, the voltage of another parked battery string, environmental conditions (e.g., temperature), the type of battery used, a threshold voltage (e.g., a threshold voltage as described previously), and/or similar factors. In one example, power controller selects an applied voltage that is a predetermined amount (e.g., 1 V) lower than the voltage of the target string. For example, if string B shown in Table 1 is selected as the target string, the applied voltage may be 51.2 V, one volt below the voltage of string B. One having skill in the art will appreciate that many different other applied voltages may be chosen so long as the applied voltage will cause the voltage of the active strings to intercept the voltage of the target string.

At block 620, when power controller 210 determines that the voltage of the active strings approximately reaches or intercepts the voltage of the target string, the power controller connects the target string to the battery circuit node via a string enable signal STR_EN. To determine when to connect the target string, power controller 210 may monitor the string sense signals STR_SNS corresponding to the target and active strings. In the Table 1 example, if string B is the target string, and string A is an active string, power controller 210 may monitor string sense signals STR_SNS_B and STR_SNS_A to see when these values are approximately equal. One having skill in the art will appreciate that due to various battery effects, the voltages and/or currents of the active and/or target strings (e.g., strings A and B) may vary rapidly and/or vary in a nonlinear or unstable fashion as power controller 210 attempts to intercept the target string and connect it to the node or shortly after it connects the target string. Due to rapid changes, during block 620, power controller 210 may monitor the string sense signals repeatedly and/or take additional steps to achieve equal voltages across the active and target strings and/or to prevent damage to the battery strings and/or other components. For example, the power controller 210 may make additional adjustments to the applied voltage, flip a fuse or breaker to prevent or respond to a high current through a battery string, and/or take other suitable steps.

Once the target string is connected, at block 630, power controller 210 initiates partial charging and testing of the target string. To do this, power controller may instruct rectifier and switch circuit 230, via control signal RECT_CTL, to raise the voltage applied to the battery circuit node to a suitable charging voltage selected on the basis of the type of battery, temperature, and/or other conditions in order to partially charge the target battery string. In some implementations, power controller may instruct rectifier and switch circuit 230 to provide charging in a current limiting mode and/or otherwise specify a fixed current and/or current profile. For example, power controller may instruct rectifier and switch circuit 230 to provide five minutes of 200 A charging current and then fifteen minutes of 50 A charging current. As another example, power controller may instruct rectifier and switch circuit 230 to provide 15 minutes of 38 A charging current. Rectifier and switch circuit may charge the target string for a specified duration of time. Alternatively, or additionally, power controller may apply a charging voltage until the target string reaches a specified voltage, I/O current, I/O power, estimated charge, or other condition, as determined by a string sense signal STR_SNS.

At block 630, while the target string is connected and is actively charging, power controller 210 may take additional measurements of the state of the target string by monitoring string sense signals STR_SNS for anomalies indicative of a high open, failed battery, unbalanced batteries, a bad connection, or other undesirable conditions. As a first example, if rectifier and switch circuit 230 is directed to provide a specific charging current (e.g., 200 A) during the first part of block 630, power controller 210 may monitor the string sense signal STR_SNS associated with the target string to identify the I/O current and/or power of the target string that is responsive to the specific charging current. If the responsive current is unexpectedly low (e.g., as compared to other strings), power controller 210 may determine that the target battery string has an anomalous "high open." As a second example, power controller may monitor the string sense signal STR_SNS associated with the target string to identify the instantaneous and/or average I/O current and/or power drawn by the target string during some period of charging, such as the end of charging (e.g., during the last 30 seconds of charging at block 630). Power controller may then compare the drawn I/O current/power with the current/power drawn by other strings or with a reference current/power and/or may determine whether non-common-mode AC noise is present in the measurement. By comparing the current draw of one battery string against another battery string in similar conditions (e.g., similar temperature), power controller 210 may determine whether the target string draws a charging current that is anomalous for the conditions. As a third example of testing, power controller may determine whether the target string has a substantially different (e.g., >5% different) discharge, charge, or self-discharge rate as compared to other strings. Power controller 210 may determine these rates from the time elapsed during charging and/or the voltage and/or current profile of the string during discharging and/or charging. As a fourth example of testing, as described previously, power controller may also determine whether a fuse 464 (e.g., a mechanically resettable breaker) repeatedly trips during charging, indicating an atypical charging current. However, power controller may perform any suitable testing processes at block 630.

If at block 630 power controller 210 detects that the target string has apparent defects such as a high open, different charging, discharging or self-discharging rates, or an anomalous charging current/power, power controller 210 may report that the string is apparently defective to a remote monitoring facility (e.g., by sending a message via OMC interface 320 using the STATUS signal) at which the defect may be logged, a trouble ticket opened, a technician dispatched, and/or the like. Power controller may also take other actions, such as disconnecting the defective string from the battery circuit node using a string enable signal STR_EN, updating its hardware configuration (e.g., to indicate that the string is apparently defective), refraining from charging the string in the future, and/or other suitable actions.

At block 640, when charging and/or testing of the target string is complete, power controller 210 disconnects the target string from the battery circuit node using a string enable signal STR_EN.

At decision block 650, power controller 210 determines whether charging and testing of all of the battery strings is complete. If some battery strings have not yet been charged/tested, process 600 repeats starting at block 610, so that the next uncharged/untested string may be charged/tested.

In the example of Table 1, after blocks 610-650 have been repeated three times, the state of various battery strings might be as shown in Table 2.

TABLE 2

Illustrative example of the state of four battery strings after three iterations of blocks 610-650.

| String Name | Voltage | Connection Status | Charge Status |
|---|---|---|---|
| A | 53.5 V | Active | Partially charged |
| B | 53.2 V | Parked | Partially charged |
| C | 53.4 V | Parked | Partially charged |
| D | 52.9 V | Parked | Partially charged |

Once all of the battery strings have been partially charged/tested via blocks 610-640, the process proceeds to block 660. At block 660 power controller 210 "tops off" the charge on all of the battery strings by applying a suitable float voltage simultaneously to all the battery strings. Power controller may determine a suitable float voltage based on the type of battery and related battery specifications, battery temperature (or other environmental conditions), and/or any other suitable criteria. Before applying a suitable float voltage to all the strings, power controller performs actions similar to those described with respect to blocks 610-620 to connect the various strings to the battery circuit node. For example, power controller 210 may repeatedly: identify a target string, select and apply a voltage to the battery circuit node to cause the voltage of the connected strings to intercept the voltage of the target string or target voltage, and then connect the target string at approximately the time when the voltages intercept. In one implementation, power controller 210 connects a battery string by selecting the unconnected string having the highest voltage of all unconnected strings, adjusting (e.g., lowering) the applied voltage to intercept the target string, and connecting the target string. Power controller then repeats this process by selecting the unconnected string having the next highest voltage, intercepting it, and connecting it, etc. To illustrate, in the example of Table 2, power controller may identify string C, apply 53.3 V to the battery circuit node, and connect string C when the voltage of string A drops to approximately 53.4 V; identify string B, apply 53.1 V to the node, and connect string B when the voltage of strings A and C drop to approximately 53.2 V; and identify string D, apply 52.8 V to the node, and connect string D when the voltage of strings A, B, and C drops to approximately 52.9 V. As another example, power controller may simply apply a 52.8 V voltage (or another voltage lower than any of the strings) continuously to the battery circuit node and connect strings C, B, and D in turn as each of their voltages is intercepted by string A.

Once all of the strings are connected in this fashion, power controller 210 may instruct rectifier and switch circuit 230 to raise or adjust the voltage to a suitable level or target voltage for float charging; power controller 210 may also instruct rectifier and switch circuit 230 to operate in a current limiting mode. During float charging, power controller 210 may perform some or all of the testing described previously with respect to block 630, since power controller 210 may be most likely to detect errors as the batteries approach a full charge and their internal resistances decrease.

Power controller 210 may terminate the float charging of one or more battery strings upon any suitable condition, including when a given time period has elapsed, when one or more battery strings reaches a particular condition or state (e.g., when a battery string has a particular output voltage, I/O current, or estimated charge), and/or when the total charging current or power provided by the rectifier and switch circuit 230 drops below a particular value that indicates that all battery strings are fully charged. To terminate top-off charging, power controller may utilize string enable signals STR_EN to disconnect one or more strings from the battery circuit node. The various strings may be disconnected either simultaneously or at different times.

Although not shown, at block 660, when disconnecting the various battery strings to terminate top-off charging, power controller may effectively rotate the battery strings (as described previously) by disconnecting a previously active battery string and leaving a previously parked battery string connected so that it may become active. To illustrate, in the example of Tables 1 and 2, after block 660 is complete, the state of the various battery strings may be as shown in Table 3.

TABLE 3

Illustrative example of the state of four battery strings after process 600.

| String Name | Voltage | Connection Status | Charge Status |
|---|---|---|---|
| A | 54 V | Parked | Charged |
| B | 54 V | Active | Charged |
| C | 54 V | Parked | Charged |
| D | 54 V | Parked | Charged |

Power controller 210 was previously described as charging and testing parked battery strings at blocks 610-650 by working from the parked battery string having the highest voltage down to the parked battery string having the lowest voltage. To illustrate, in the example of Table 1, string B may be charged first, then string C, then string D. In such implementations, the applied voltage used between blocks 610 and 620 will generally remain equal and/or drop each time these blocks are repeated so that the voltage of the active strings may intercept the next target battery string. To illustrate, in the example of Table 1, between blocks 610 and 620, the power controller may apply 51.2 V when connecting battery string B, 48.0 V when connecting battery string C, and 47.5 V when connecting battery string D.

One having skill in the art will appreciate that parked battery strings may be charged and tested in any other suitable order, so long as the voltage of the connected battery strings roughly intercepts the voltage of the target string at the time the target string is connected. For example, the power controller may charge and test the parked battery strings by working from the parked battery string having the lowest voltage up to the parked battery string having the highest voltage. To illustrate, in this type of implementation, in the example of Table 1, string D would be charged/tested first, then string C, and finally, string B. In such implementations, the applied voltage used, between blocks 610 and 620 will generally remain equal and/or increase each time these blocks are repeated so that the voltage of the active strings will intercept the next target battery string. To illustrate, in the example of Table 1, between blocks 610 and 620, the rectifier and switch circuit 230 may apply 47.5 V when connecting battery string D, 48.0 V when connecting battery string C, and 51.2 V when connecting battery string B.

Similarly, power controller 210 was previously described at block 660 as intercepting and connecting battery strings by working from the highest voltage string to the lowest voltage. One having skill in the art will appreciate that at block 660, power controller may instead connect battery strings to the battery circuit node in a different order, so long as the voltage of the connected battery strings roughly intercepts the voltage of the target string at the time the target string is connected. For example, in some implementations, power controller may apply a voltage that is equal to or lower than the voltage of any disconnected string, connect the lowest voltage string to the battery circuit node when that string is intercepted, apply the suitable floating voltage to the battery circuit node, and as the voltage of the connected battery strings rises (due to the higher applied floating voltage), add additional battery strings as they are intercepted. To illustrate, in the example of Table 2, power controller 210 may apply a 51.9 V source to the battery circuit node and connect lowest-voltage string D when active string A reaches 52.9 V. Then power controller 210 may instruct rectifier and switch circuit 230 to apply a suitable float voltage (e.g., 54 V), causing the voltage of connected strings A and D to rise and intercept the voltage of string B (which is then connected), and then finally intercept the voltage of string C (which is connected last).

FIG. 7 is a logical flow diagram of process 700 for handling a power failure. Before process 700 begins, power controller 210 may maintain one or more active battery strings (e.g., 461A) in a floating state, at approximately a float or target voltage, while one or more parked strings (e.g., 461B, 461C, 461D) are disconnected from the battery circuit node. To do so, power controller may maintain the connection of the active string(s) to the battery circuit node and, when primary and/or alternate power sources are available, instruct the rectifier and switch circuit 230 to provide a float voltage to the active strings (e.g., provide a voltage sufficient to keep the active string(s) at approximately full charge under present conditions, such as temperature in the battery circuit).

Table 4 shows example states of four battery strings prior to the process of FIG. 7. The example values shown in Table 4 will be referenced in further discussions herein to illustrate various concepts related to FIG. 7.

TABLE 4

Illustrative example of the state of four battery strings before process 700.

| String Name | Voltage | Connection Status | Charge Status |
|---|---|---|---|
| A | 54 V | Active | Charged |
| B | 53.6 V | Parked | Uncharged |
| C | 53.8 V | Parked | Uncharged |
| D | 53.5 V | Parked | Uncharged |

As described previously, process 700 of FIG. 7 may be triggered when power controller 210 detects a power failure, e.g., if due to a blackout, primary power signal PRI_IN fails to provide sufficient power to operate communications interface 280. As described previously in reference to block 580, when an external power source fails, power controller 210 may instruct rectifier and switch circuit 230 to route battery power from the battery circuit node to communications interface 280, power controller 210, and/or other loads. As a result of this load on the battery circuit, the active batteries may begin to discharge, and the voltage at the battery circuit node (and across the active, connected battery strings) will drop before and during process 700.

The process 700 of FIG. 7 begins at block 710, where power controller 210 selects one or more parked strings as target strings. Typically, power controller selects the one or more parked strings that have the highest voltages as compared to other parked strings. To illustrate, in the example of Table 4, power controller may first select parked string C, since it has the highest voltage of all of the parked strings, then string B, then string D. Additionally, or alternatively, at block 710, power controller may determine the number of strings to select and which parked strings to select on the bases of time (e.g., time elapsed since the power failure), a voltage of a parked string, a voltage of an active string, an estimated power or charge being drawn by the load, the measured capacity of the various battery strings, the calculated capacity of the various battery strings, a condition of the parked strings (e.g., whether they have failed during prior testing), and/or the expected capacity of the various battery strings. For example, at block 710, power controller may estimate the current capacity of the active strings and their rate of discharge based on the active strings' current voltage, the discharge current, the temperature, and specified manufacturer and/or configuration parameters. As another example, power controller may determine that the current load necessitates the addition of one additional battery string, string C.

At block 720, power controller 210 utilizes one or more string enable signals STR_EN to connect the selected target string(s). Power controller 210 connects a target string when its voltage is intercepted by the voltage of the active and connected battery strings, which is dropping due to the load.

At block 730, power controller 210 monitors the target string(s) and other strings that were previously connected to the battery circuit node (e.g., strings that were active before the power failure). For example, power controller 210 may monitor the string sense signals STR_SNS to determine the voltage, I/O current, I/O power, and/or discharge rate of the target strings(s) and/or batteries therein so that power controller may perform decision block 750 and repeat blocks 710 and 720 as necessary.

In some implementations, at block 730 power controller 210 may also monitor the target string(s) and other connected strings to detect discharge errors. For example, power controller 210 may determine whether connected string(s) have different DC values, are experiencing fluctuations in their output voltage, have significant noise, or have substantially different discharge rates. Power controller may also determine whether a connection is arcing and/or whether there are anomalous currents that might damage the load, a battery string, and/or another component. As yet another example, power controller 210 may determine whether a fuse 464 in a battery string has tripped open after a target string was added. If a fuse is a resettable breaker, power controller 210 may close the breaker after a predetermined amount of time.

Power controller 210 may determine that a discharge error occurred if there is a difference of more than five to eight percent between the output voltages and/or discharge rates of the battery strings, if non-common-mode AC noise above a given threshold is detected, if a fuse trips a specified number of times during a period, and/or the like. If power controller detects a discharge error, it may report a defective string or battery to a remote monitoring location (e.g., by sending a message via OMC interface 320 using the STATUS signal) at which the error may be logged, a trouble ticket opened, a technician dispatched, and/or the like. Power controller may also take other actions, such as disconnecting the defective string from the battery circuit node using a string enable signal STR_EN, updating power controller's hardware configuration (e.g., to indicate that the string is defective), and/or other suitable actions.

At block 740, power controller 210 monitors the remaining parked strings that are unconnected to the battery circuit node. For example, power controller 210 may monitor the voltage, I/O current, I/O power, and/or discharge rate of the remaining strings(s) so that power controller may perform decision block 750 and repeat blocks 710 and 720 as necessary.

At decision block 750, power controller 210 determines whether the voltage of the target string(s) and other connected strings is still above the remaining strings. If not, process 700 repeats starting at block 710. Otherwise, process 700 proceeds to decision block 760, where power controller determines whether the power failure has ended, e.g., whether a blackout has ended and primary power signal is back to its full power. If the power failure has ended, process 700 returns. Otherwise process 700 repeats starting at block 730.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above Detailed Description of examples of the invention is not intended to be exhaustive or to limit the invention to the precise form disclosed above. While specific examples for the invention are described above for illustrative purposes, various equivalent modifications are possible within the scope of the invention, as those skilled in the relevant art will recognize. For example, while processes or blocks are presented in a given order, alternative implementations may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed or implemented in parallel, or may be performed at different times. Further any specific numbers noted herein are only examples: alternative implementations may employ differing values or ranges.

The teachings of the invention provided herein can be applied to other systems, not necessarily the system described above. The elements and acts of the various examples described above can be combined to provide further implementations of the invention. Some alternative implementations of the invention may include not only additional elements to those implementations noted above, but also may include fewer elements.

Any patents and applications and other references noted above, including any that may be listed in accompanying filing papers, are incorporated herein by reference. Aspects of the invention can be modified, if necessary, to employ the systems, functions, and concepts of the various references described above to provide yet further implementations of the invention.

These and other changes can be made to the invention in light of the above Detailed Description. While the above description describes certain examples of the invention, and describes the best mode contemplated, no matter how detailed the above appears in text, the invention can be practiced in many ways. Details of the system may vary considerably in its specific implementation, while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific examples disclosed in the specification, unless the above Detailed Description section explicitly defines such terms. Accordingly, the actual scope of the invention encompasses not only the disclosed examples, but also all equivalent ways of practicing or implementing the invention under the claims.

To reduce the number of claims, certain aspects of the invention are presented below in certain claim forms, but the applicant contemplates the various aspects of the invention in any number of claim forms. For example, while only one aspect of the invention is recited as a means-plus-function claim under 35 U.S.C. sec. 112, sixth paragraph, other aspects may likewise be embodied as a means-plus-function claim, or in other forms, such as being embodied in a computer-readable medium. (Any claims intended to be treated under 35 U.S.C. §112, ¶6 will begin with the words "means for", but use of the term "for" in any other context is not intended to invoke treatment under 35 U.S.C. §112, ¶6.) As another example, although the current claims are primarily directed to systems and methods that provide backup or supplementary battery power to radio and telecommunications circuitry at a cell site or base station, the inventors recognize that the invention could be practiced in any environment where a battery circuit powers a system, including any environment where a battery circuit provides backup or supplementary power to a system. Accordingly, the applicant reserves the right to pursue additional claims after filing this application to pursue such additional claim forms, in either this application or in a continuing application.

The invention claimed is:

1. A system for providing supplementary or emergency power, the system comprising:
    a battery circuit connected to a battery circuit node, wherein the battery circuit node is configured to provide battery power, and wherein the battery circuit comprises—
        multiple battery strings, wherein each battery string comprises:
            one or more batteries coupled in a series configuration; and
            at least one switch circuit configured to selectively couple the one or more batteries to the battery circuit node,
            wherein the battery circuit node is configured to provide power, and to receive a charging current for charging batteries; and
    a power controller configured to:
        selectively couple one or more of the multiple battery strings in the battery circuit to the battery circuit node,
            wherein a battery string coupled to the battery circuit node operates as an active battery string,
            wherein the active battery string provides via the battery circuit node, and
            wherein the active battery string actively receives the charging current to maintain the active battery string at or near a full charge;
        selectively decouple at least one of the one or more of the multiple battery strings in the battery circuit from the battery circuit node,
            wherein a battery string decoupled from the battery circuit node operates as a parked battery string,
            wherein the parked battery string does not actively receive the charging current; and,
        upon an occurrence of a battery change event, to—
            (i) couple the parked battery string to the battery circuit node to provide power and to actively receive the charging current; or
            (ii) decouple the active battery string from the battery circuit node and to no longer receive the charging current; or
            (iii) both (i) and (ii); and,
        wherein the battery change event includes at least one of a specified charging event, a specified testing event, or a power failure event.

2. The system of claim 1, further comprising: a rectifier and switch circuit configured to charge the battery circuit and to route power from the battery circuit to a load under control of the power controller.

3. The system of claim 1, wherein each battery string further includes an associated current sensor, and wherein the power controller is further configured to monitor each of the current sensors to determine a status of an associated battery string.

4. The system of claim 1, wherein the system is configured to test the battery circuit, charge the battery circuit, and provide power to radio and telecommunications circuitry to handle power failures.

5. The system of claim 1, wherein the power controller is further configured to select one or more of the multiple battery strings in the battery circuit to operate as active battery strings on the basis of:
    a function of time;
    a measured capacity of one or more battery strings;
    a calculated capacity of one or more battery strings; or
    an expected capacity of one or more battery strings.

6. A method, comprising:
    determining an indication that one or more operations related to management of a battery circuit is to be performed,
        wherein the battery circuit comprises multiple battery strings, and wherein each battery string in the battery circuit further comprises:
            two or more batteries arranged in a serial fashion and configured to provide backup power;
            a string connection switch configured to selectively couple and decouple the battery string from a battery circuit node; and,
            a sensor configured to provide a string sense signal indicating conditions relating to at least one state of the battery string; and
        wherein the determined indication comprises:
            a battery test event indicating that the battery circuit is to be tested;
            a battery rotation event indicating that at least one of the following is to be performed—
                (i) rotating one or more battery strings from a parked status into an active status,
                (ii) rotating one or more battery strings from an active status to a parked status, or
                (iii) both (i) and (ii);
    initiating a battery test process when the determined indication comprises the battery test event, wherein the battery test process comprises selectively coupling one or more battery strings to the battery circuit node for testing;
    initiating a battery rotation process when the determined indication comprises the battery rotation event, wherein the battery rotation process comprises at least one or both of—
        selectively coupling one or more battery strings to the battery circuit node and into the active status, and
        selectively decoupling one or more battery strings from the battery circuit node and into the parked status.

7. The method of claim 6, wherein the determined indication further comprises:
    a battery charging event indicating that the battery circuit is to be charged; and
    a power failure event indicating that an external power failure exists;
    and wherein the method further comprises—
    initiating a battery charging process when the determined indication comprises the battery charging event, wherein the battery charging process comprises selectively coupling one or more battery strings to the battery circuit node for charging; and,
    initiating a power failure handling process when the determined indication comprises the power failure event, wherein the power failure handling process comprises selectively coupling one or more battery strings in the parked status to the battery circuit node to provide backup power to the radio and telecommunications circuitry at the base station.

8. The method of claim 6, wherein a battery test process and a battery charging process are substantially simultaneously performed, and wherein the method further comprises:
   selecting a target battery string;
   adjusting a voltage applied to the battery circuit node to equalize a voltage across one or more active battery strings coupled to the battery circuit node and a voltage across the target battery string, wherein the voltage applied is selected based on at least one of the following:
      the voltage across the target battery string,
      the voltage across one or more active battery strings,
      environmental conditions near the battery circuit, or
      types of batteries in the battery circuit;
   selectively coupling the target battery string to the battery circuit node when the voltage across the one or more active battery strings approximately reaches the voltage across the target battery string;
   applying a charging voltage to the battery circuit node, wherein the charging voltage is based on a type of battery in the battery circuit or environmental conditions at or near the battery circuit; and
   utilizing the string sense signal associated with the target battery string to determine whether the target battery string experiences anomalous currents in response to the applied charging voltage.

9. The method of claim 6, wherein the determined indication comprises a battery charging event, and the detected battery charging event comprises a voltage of a battery string in the battery circuit falling below a threshold value, wherein the threshold value corresponds to a particular level of estimated charge stored in the battery string.

10. The method of claim 6, wherein the determined indication comprises the battery charging event, and the detected battery charging event comprises:
   a current time occurring within an off-peak time period when commercial utility power rates are lower than rates for other periods; and
   a voltage of a battery string in the battery circuit falling below a threshold value, wherein the threshold value corresponds to a selected level of estimated charge stored in the battery string.

11. The method of claim 6, wherein selectively coupling a battery string to the battery circuit node comprises:
   adjusting a voltage across one or more other battery strings coupled to the battery circuit node to approximately equal a voltage across the battery string to be selectively coupled; and
   utilizing a string connection switch to selectively couple the battery string to the battery circuit node when the voltage across the one or more other battery strings approximately equals the voltage across the battery string that is to be selectively coupled.

12. The method of claim 6, wherein initiating a battery test process further comprises:
   selecting a target battery string;
   selectively coupling the target battery string to the battery circuit node; and
   utilizing the string sense signal associated with the target battery string to determine whether the target battery string experiences anomalous currents in response to a charging source applied to the battery circuit node, and comparing currents in the target battery string to currents in other battery strings in the battery circuit.

13. The method of claim 6, wherein initiating a battery test process further comprises selecting a target battery string, selectively coupling the target battery string to the battery circuit node, and utilizing the string sense signal associated with the target battery string to determine whether the target battery string has a substantially different charging, discharging, or self-discharging rate as compared to one or more other battery strings in the battery circuit.

14. The method of claim 6, wherein initiating a battery test process further comprises selecting a target battery string via an electronically resettable breaker positioned in serial with the one or more batteries of the target battery string, selectively coupling the target battery string to the battery circuit node, and utilizing the electronically resettable breaker to determine whether the target battery string has failed.

15. The method of claim 6, wherein the determined indication comprises a battery test event, and the detected battery test event comprises a voltage of a battery string in the battery circuit falling below a threshold value, wherein the threshold value corresponds to a particular level of estimated charge stored in the battery string.

16. The method of claim 6, wherein initiating a battery rotation process further comprises selecting a battery string to rotate into an active status, wherein the battery string is selected by determining which battery string in the battery circuit has a lowest accumulated time in active status.

17. A non-transitory computer-readable medium carrying instructions that, when performed by a processor, perform a method for a battery circuit, the method comprising:
   determining an indication that at least one of multiple battery strings is to be charged and tested, wherein each battery string in the battery circuit further comprises:
      multiple batteries arranged in a serial fashion;
      a connection switch configured to selectively couple and decouple the battery string; and
      a sensor configured to provide a string sense signal indicating conditions relating to a state of the battery string; and,
   initiating battery test and charging processes, further comprising:
      selecting a target battery string having a voltage;
      adjusting a voltage applied so that a voltage across one or more active battery strings reaches the voltage across the target battery string, wherein the voltage applied is selected based on at least one of the following:
         the voltage across the target battery string,
         the voltage across one or more active battery strings,
         one or more environmental conditions at or near the battery circuit, or
         a type of at least one battery in the battery circuit;
      selectively coupling the target battery string to supply power, as needed, to radio and telecommunications circuitry at a base station when the voltage across the one or more active battery strings approximately reaches the voltage across the target battery string; and,
      utilizing the string sense signal associated with the target battery string to determine whether the target battery string experiences anomalous currents in response to the applied charging voltage.

18. The non-transitory computer-readable medium of claim 17, wherein a current sensor is coupled to and associated with each battery string; and the method further comprising:
   monitoring each of the current sensors to determine a status of an associated battery string;
   monitoring a particular current sensor associated with a particular battery string to determine a self-discharging rate of the particular battery string; and evaluating whether the determined self-discharging rate is anomalous as compared to other battery strings in the battery circuit or based on empirical data.

19. The non-transitory computer-readable medium of claim 17, wherein a current sensor is coupled to and associated with each battery string; and the method further comprising:

monitoring each of the current sensors to determine a status of an associated battery string;

monitoring a particular current sensor associated with a particular battery string to determine a charging or discharging rate of the particular battery string; and evaluating whether the determined charging or discharging rate is anomalous as compared to other battery strings in the battery circuit or based on empirical data.

20. The non-transitory computer-readable medium of claim 17, further comprising:

beginning charging the battery circuit at a first voltage that is based on a voltage across a parked battery string having a lowest string voltage as compared to other parked battery strings, applying a second, higher charging voltage to the battery circuit, and repeatedly coupling an additional battery string to the battery circuit as a voltage of the coupled battery strings rises to a voltage of the additional battery string due to the second, applied charging voltage.

* * * * *